(12) United States Patent
Ikeda

(10) Patent No.: US 7,719,338 B2
(45) Date of Patent: May 18, 2010

(54) PULSE GENERATING CIRCUIT AND UWB COMMUNICATION SYSTEM

(75) Inventor: Masayuki Ikeda, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/131,956

(22) Filed: Jun. 3, 2008

(65) Prior Publication Data

US 2008/0303575 A1   Dec. 11, 2008

(30) Foreign Application Priority Data

Jun. 5, 2007   (JP) .............................. 2007-148981
Feb. 25, 2008  (JP) .............................. 2008-042517

(51) Int. Cl.
*G06F 1/04*   (2006.01)

(52) U.S. Cl. ...................... 327/291; 327/295

(58) Field of Classification Search ......... 327/291–294, 327/295–299
See application file for complete search history.

(56) References Cited

U.S. PATENT DOCUMENTS

| | | | |
|---|---|---|---|
| 5,260,608 A * | 11/1993 | Marbot | 327/261 |
| 5,463,337 A * | 10/1995 | Leonowich | 327/158 |
| 6,037,812 A * | 3/2000 | Gaudet | 327/116 |
| 6,421,389 B1 | 7/2002 | Jett et al. | |
| 7,449,932 B2 * | 11/2008 | Ikeda | 327/291 |
| 7,539,267 B2 * | 5/2009 | Sahinoglu et al. | 375/295 |
| 2001/0033576 A1 | 10/2001 | Richards | |
| 2003/0108133 A1 | 6/2003 | Richards | |

FOREIGN PATENT DOCUMENTS

| | | |
|---|---|---|
| JP | 2006-191484 | 7/2006 |
| JP | 2006-229677 | 8/2006 |
| JP | 2006-238479 | 9/2006 |

OTHER PUBLICATIONS

"A CMOS Impulse Radio Ultra-Wideband Tranceiver for 1 Mb/s Data Communications and ±2.5cm Range Findings", T. Terada et al., 2005 Symposium on VLSI Circuits Digest of Technical Papers, pp. 30-33.

* cited by examiner

*Primary Examiner*—Hai L Nguyen
(74) *Attorney, Agent, or Firm*—Harness, Dickey & Pierce, P.L.C.

(57) ABSTRACT

A pulse generating circuit includes a starting circuit which generates m (two or larger integer) starting signals at predetermined time intervals based on a generation starting signal, and m pulse wave generating sub circuits which have the same characteristics and generate pulse waves having pulse width Pw for n cycles (n: 1 or larger integer) based on the respective m starting signals.

14 Claims, 19 Drawing Sheets

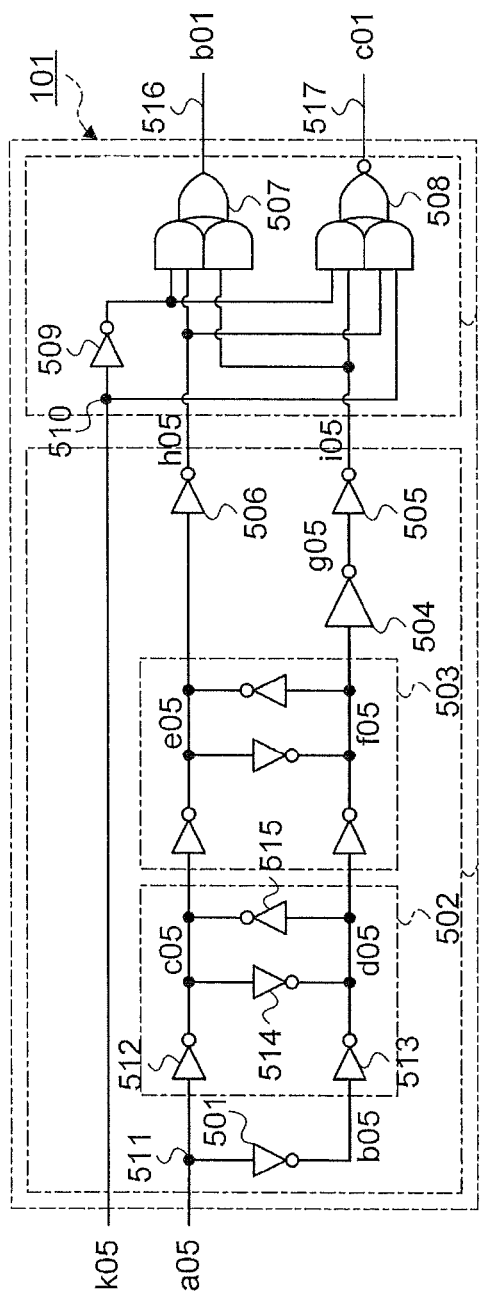
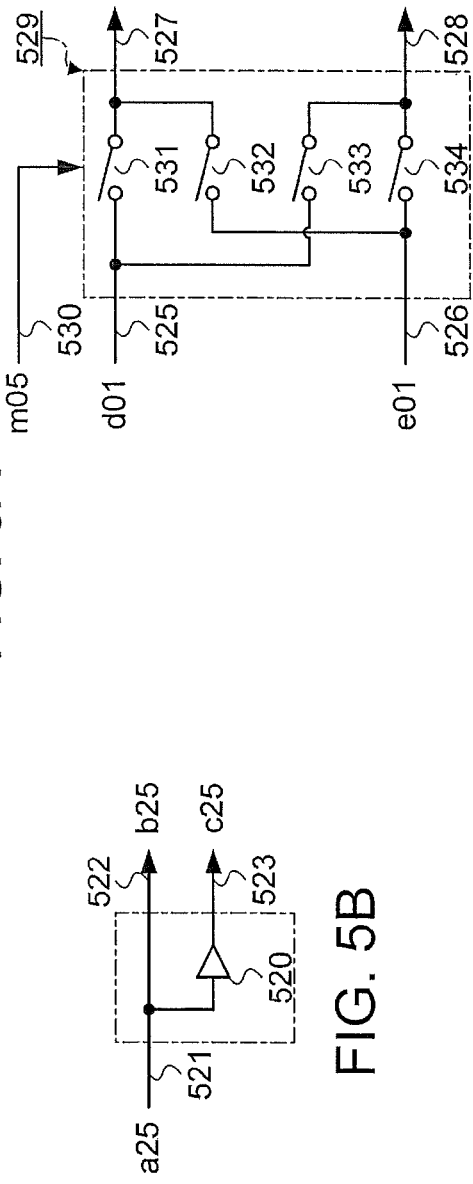
FIG. 5A
FIG. 5B
FIG. 5C

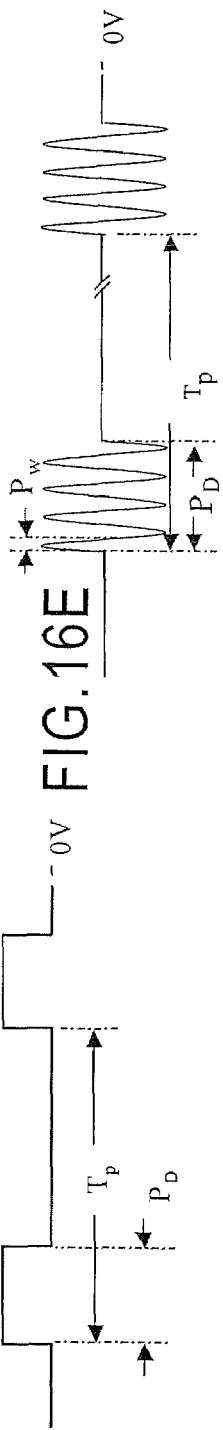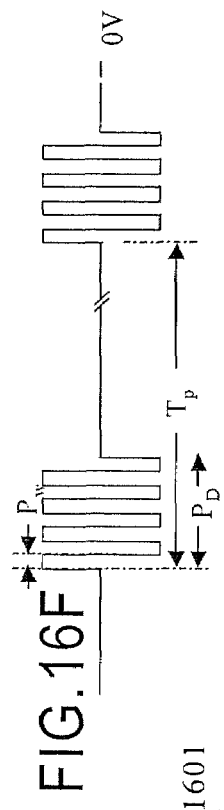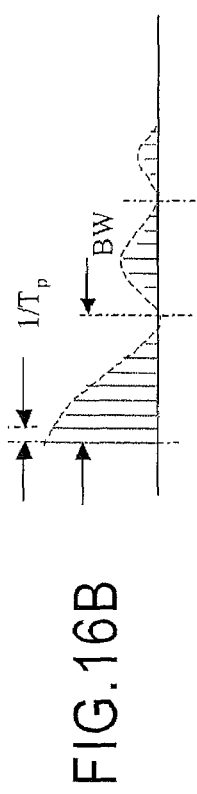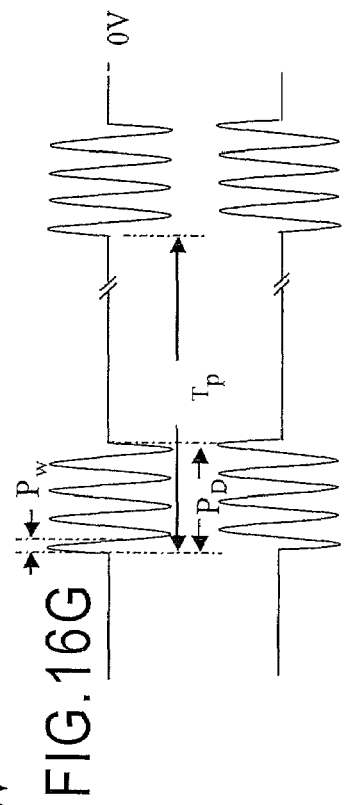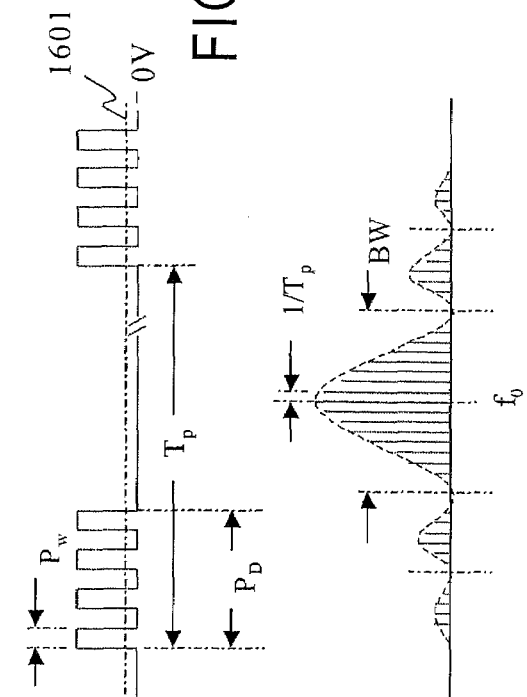
FIG.16A  FIG.16B  FIG.16C  FIG.16D  FIG.16E  FIG.16F  FIG.16G

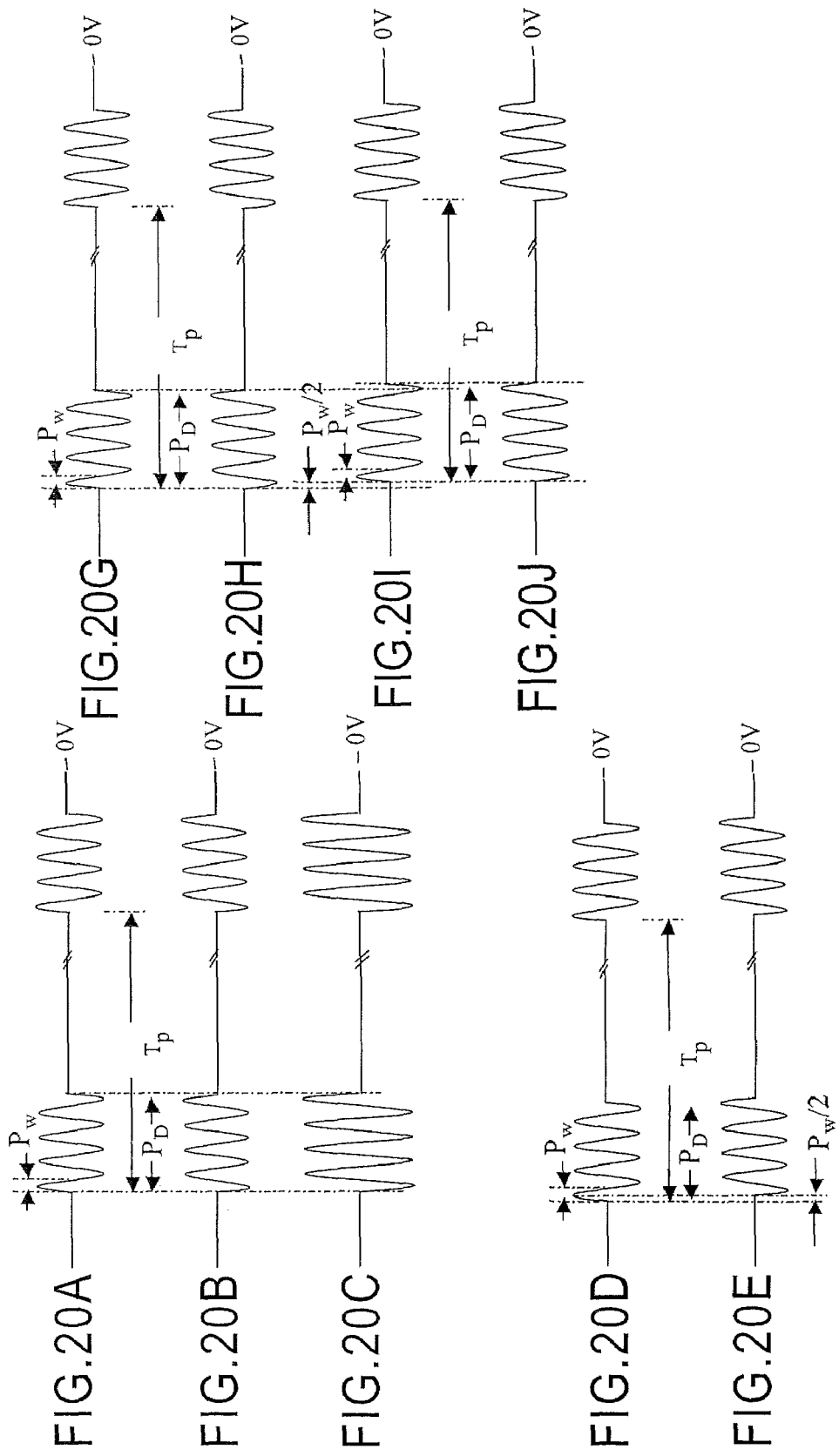

PULSE GENERATING CIRCUIT AND UWB COMMUNICATION SYSTEM

BACKGROUND

1. Technical Field

The present invention relates to a pulse generating circuit for generating pulses appropriate for UWB (ultra wide band) communication, and a UWB communication system.

2. Related Art

A UWB communication system is a communication system which provides high-speed and large-capacity data communication using an extremely wide frequency band. For generating wide-band signals, the UWB communication system employs method utilizing extremely short-period pulses as well as spectrum diffusion method and orthogonal frequency division multiplexing (OFDM) method used in related art. The system using the extremely short pulses is particularly called impulse radio (IR) system communication. The IR system can achieve modulation and demodulation not by the related-art modulation method but only by time base operation. Thus, simplification of circuits and reduction of power consumption are expected for this system (see U.S. Pat. No. 6,421,389, US Patent Application Publication No. 2003/0108133A1, and US Patent Application Publication No. 2001/0033576).

The pulse waveform used in the IR system is now briefly explained. Pulse waves having a pulse width $P_D$ and a cycle $T_P$ shown in FIG. 16A are well known. The frequency spectrum of these pulse waves is sinc function whose envelope has first zero point when $BW=1/P_D$ as shown in FIG. 16B.

This pulse waveform whose spectrum extends to BW from direct current is difficult to use, and such a pulse waveform whose spectrum center is located at a high position in the frequency as shown in FIG. 16D is preferable. This pulse type of waveform is the pulse waveform shown in FIG. 16C whose frequency spectrum has been shifted to a higher position by multiplying pulses shown in FIG. 16A by pulse waves having frequency $f_0=1/2Pw$. Each section of the pulse width $P_D$ contains several pulses having a width Pw ($Pw=1/(2f_0)$) as half of the carrier wave cycle. However, this waveform includes direct current (DC) components indicated by an alternate long and short dash line 1601 in FIG. 16C, and does not accurately have ideal spectrum shown in FIG. 16D.

FIG. 16E shows a waveform having this ideal spectrum. This waveform has pulses shown in FIG. 16A multiplied by sine waves at the carrier frequency $f_0$. FIG. 16F shows a waveform having pulses shown in FIG. 16A multiplied by rectangular waves at the carrier frequency $f_0$, and is easily generated in digital circuits. Since digital circuits produce narrow pulse width, the generated waveform is not angular as shown in FIG. 16F but generally becomes a waveform shown in FIG. 16E. Other pulse waves different from those shown in the figure but ideal for the UWB communication have been currently proposed, and many of them are used due to easiness of generation methods.

Related Art 1

FIG. 17A shows an example of a circuit in related art which generates pulses shown in FIG. 16C (see *A CMOS IMPULSE RADIO ULTRA-WIDEBAND TRANCEIVER FOR 1 Mb/s DATA COMMUNICATIONS AND ±2.5 cm RANGE FINDINGS*, T. Terada et. al, 2005 Symposium on VLSI Circuits Digest of Technical Papers, pp. 30-33). Two inverters 1701 and 1702 and an NOR circuit 1703 constitute three ring generating circuits when the other input $C_i$ of the NOR 1703 is false (L: low level). More specifically, as shown in the timing chart in FIG. 17B, pulses are generated only while Ci is at L level, and changes of output NR of the NOR 1703 and outputs N1 and N2 of the inverters 1701 and 1702 are transmitted with delay time td for each.

For simplifying the explanation, it is assumed herein that the rising time and falling time of the NOR 1703 and the inverters 1701 and 1702 are all the same. Thus, the pulse width ($P_w$ in FIG. 16C) of the pulses generated from this circuit is 3 td. In this case, the shortest possible pulse width generated by this circuit is three times longer than the delay time of the elements constituting the circuit, which is the smallest pulse width of the pulses generated by this circuit.

Related Art 2

According to the UWB communication, the pulses generated by this method are used not only by a transmitting device but also by a receiving device as template pulses for calculating correlation with receiving signals. The receiving device processes differential signals in many cases, and often requires two types of signals whose phases are reversed as shown in FIG. 16G. Differential pulse signals are effectively used by the transmitting device as well at the time of actuation of balanced antenna or for other purpose. The receiving circuit further requires I and Q orthogonally crossing signals whose phases are different from each other by 90 degrees in many cases.

*A Low-Power Template Generator for Coherent Impulse-Radio Ultra Wide-Band Receivers*, Jose Luis et. al, Proceedings IEEE ICUWB, 2006 pp 97-102, discloses a circuit for generating balanced pulses. According to this circuit, several differential circuits are connected in line to generate pulse waves having a pulse width corresponding to delay of one delay circuit by using logic circuits. This reference also describes that pulses can be generated at both rising and falling of signals inputted to the delay circuits so as to achieve power consumption reduction, and that the I and Q signals can be generated by using every other circuit of the connected delay circuits.

According to the related-art technologies, both Di and XDi are always generated due to complementary structure of the delay circuits. Thus, the I and Q signals can also be easily generated. In the method which complementarily uses P channel MOS transistors and N channel MOS transistors to obtain differential signals, however, unbalanced signals are generated when the constants of both the P and N channel MOS transistors are unbalanced. When signals contain unbalanced components, output errors increase particularly in such a case where the receiving device has a correlation unit.

Moreover, according to the above disclosures, pulses are generated at both the rising and falling edges of the generation starting signals so as to achieve power savings. However, the polarities of the pulses generated at the rising timing and the pulses generated at the falling timing are reversed, which imposes severe limitation to modulating operation and generation timing.

SUMMARY

It is an advantage of some aspects of the invention to provide a pulse generating circuit and a UWB communication system capable of solving at least a part of the above problems.

(1) A pulse generating circuit according to a first aspect of the invention includes a starting circuit which generates m (two or larger integer) starting signals at predetermined time intervals based on a generation starting signal, and m pulse wave generating sub circuits which have the same characteristics and generate pulse waves having pulse width Pw for n cycles (n: 1 or larger integer) based on the respective m starting signals.

According to this structure, differential pulse waves having stabilized DC level and preferable symmetry can be generated by using the plural pulse wave generating sub circuits having the same characteristics and controlling the starting time of the respective pulse wave generating sub circuits. Differential signals having phase difference by 180 degrees can be obtained when the predetermined time interval of the m starting signals is set at a value equivalent to the pulse width Pw of the pulse waves. Also, I and Q signals having phase difference of 90 degrees can be obtained when the interval is set at a value equivalent to half of the Pw.

(2) According to a second aspect of the invention, the pulse wave generating sub circuits in the pulse generating circuit include a plurality of inverter delay circuits each delay of which is set at the pulse width Pw, and a pulse wave generating logic circuit which generates the pulse waves based on output signals from the plural inverter delay circuits.

According to this structure, the inverter delay circuits and pulse wave generating logic circuits produced by ordinary semiconductor process are used. Thus, the structure is highly integrated.

(3) According to a third aspect of the invention, the pulse generating circuit includes the two pulse wave generating sub circuits, and each of the pulse wave generating sub circuits generates the pulse waves based on the corresponding one of the two starting signals generated from the starting circuit which sets the predetermined time interval at the pulse width Pw.

According to this structure, each of the pulse wave generating sub circuits generates the pulse waves at the intervals of the pulse width Pw. Thus, two signals having phase difference by 180 degrees can be produced. Since the pulse wave generating sub circuits generating the pulse waves have the same characteristics, the pulse waves generated from the pulse wave generating sub circuits become differential pulse waves having stabilized DC level and preferable symmetry.

(4) According to a fourth aspect of the invention, the pulse generating circuit includes the two pulse wave generating sub circuits, and each of the pulse wave generating sub circuits generates the pulse waves based on the corresponding one of the two starting signals generated from the starting circuit which sets the predetermined time interval at the pulse width Pw/2.

According to this structure, each of the pulse wave generating sub circuits generates pulse waves having the pulse width Pw at the time intervals of Pw/2. Thus, two signals having phase difference by 90 degrees can be produced. Since the pulse wave generating sub circuits generating the pulse waves have the same characteristics, the pulse waves (I and Q signals) generated from the pulse wave generating sub circuits become differential pulse waves having stabilized DC level and preferable symmetry.

(5) According to a fifth aspect of the invention, the pulse generating circuit includes the four pulse wave generating sub circuits, and each of the pulse wave generating sub circuits generates the pulse waves based on the corresponding one of the four starting signals generated from the starting circuit which sets the predetermined time interval at the pulse width Pw/2.

According to this structure, each of the pulse wave generating sub circuits generates four pulse waves having the pulse width Pw at the time intervals of Pw/2. Thus, four signals having phase difference by 90 degrees, that is, two pairs of differential signals (I and Q differential signals) having different phases by 90 degrees are produced. Since the pulse wave generating sub circuits generating the pulse waves have the same characteristics, the pulse waves (I and Q signals) generated from the pulse wave generating sub circuits become differential pulse waves having stabilized DC level and preferable symmetry.

(6) According to the sixth aspect of the invention, the pulse generating circuit of the fourth or fifth aspect further includes an adding and subtracting circuit which achieves addition and subtraction of the pulse waves generated from the respective pulse wave generating sub circuits.

According to this structure, new signals are produced by achieving addition or subtraction of the signals generated from the respective pulse wave generating sub circuits. Thus, the degree of orhotonalization of the I and Q pulse signals generated from the pulse generating circuit of the fourth or fifth aspect can be further improved.

(7) According to a seventh aspect of the invention, the starting circuit in the pulse generating circuit of the first, second or third aspect includes a bi-phase signal generating circuit for generating signals of two phases which simultaneously rise and fall based on the generation starting signal, and the inverter delay circuit connected to one of output signals from the bi-phase signal generating circuit.

According to this structure, the starting circuit can generate starting signals of two phases at the time intervals equivalent to the delay of the inverter delay circuit contained in the pulse wave generating sub circuits. Thus, the time interval of the starting timing for starting the pulse wave generating sub circuits can accurately coincide with the pulse width Pw of the pulse waves generated from the pulse wave generating sub circuits.

(8) According to an eight aspect of the invention, the starting circuit in the pulse generating circuit of the first, second, fourth or sixth aspect includes a first delay circuit producing delay set at the pulse width Pw and a second delay circuit producing delay set at a value equivalent to the pulse width Pw×1.5.

When two pulse waves having phase difference of 90 degrees are generated, the starting time difference between the pulse wave generating sub circuits is required to be set at half of the pulse width Pw of the pulse waves generated from the pulse wave generating sub circuits. However, it is difficult to produce the time difference corresponding to half of the pulse width Pw when the circuits operate at a high speed close to the limit of the elements. According to this structure, the delay time difference corresponding to half of the pulse width Pw can be produced by using the delay time difference between the second delay circuit having delay of the pulse width Pw×1.5 and the first delay circuit having delay of the pulse width Pw.

(9) According to a ninth aspect of the invention, the pulse generating circuit further includes a starting signal selecting circuit which selects one pulse wave generating sub circuit which receives the m starting signals generated from the starting circuit from the m pulse wave generating sub circuits based on transmitted data.

According to this structure, modulation can be applied based on the transmitted data. Thus, the pulse generating circuit can be appropriately used for UWB communication.

(10) According to a tenth aspect of the invention, the pulse generating circuit further includes an output selecting circuit which selects one pulse wave output target which receives the pulse waves generated from the m pulse wave generating sub circuits from pulse wave output targets based on transmitted data.

According to this structure, modulation can be applied based on the transmitted data. Thus, the pulse generating circuit can be appropriately used for UWB communication.

(11) According to an eleventh aspect of the invention, the pulse generating circuit of the third or seventh aspect further includes a cross couple inverter connected between output nodes where the phases of the outputs from the inverter delay circuits contained in the pulse wave generating sub circuits are reversed in a predetermined pair of the m pulse wave generating sub circuits.

According to this structure, slight phase shift caused by small errors of delays of the respective inverter delay circuits contained in the pair of the pulse wave generating sub circuits is corrected by the cross couple inverter. Thus, more accurate pulses can be generated.

(12) According to a twelfth aspect of the invention, in the pulse generating circuit, the pulse width of the generation starting signal inputted to the starting circuit is equal to and larger than the pulse width Pw and smaller than a value equivalent to pulse width Pw×4×n.

According to this structure, unnecessary pulse waves can be covered by decreasing the pulse width of the generation starting signal shorter than that of the pulse waves for n cycles generated from the pulse generating circuit. Thus, generation of noise can be reduced.

(13) According to a thirteenth aspect of the invention, in the pulse generating circuit, the cycle of the generation starting signal inputted to the starting circuit is a cycle equivalent to a value an even number times larger than the pulse width Pw.

According to this structure, successive pulse waves can be generated by starting the pulse wave generating sub circuits periodically.

(14) According to a fourteenth aspect of the invention, in the pulse generating circuit, the inverter delay circuit can control delay of the inverter delay circuit based on an outside control signal.

According to this structure, delay of the inverter delay circuit can be controlled according to the outside control signal. Thus, fluctuations and errors of the generated pulses caused by manufacture variances and changes in operation temperature and source voltage can be corrected.

(15) According to a fifteenth aspect of the invention, a UWB communication system includes the pulse wave generating circuit described above.

According to this structure, extremely narrow pulses particularly used for UWB can be easily produced as differential signals by the pulse generating circuit. In this case, differential and stable circuit system can be applied to template generating circuits of modulation circuits and demodulation circuits by using the pulses thus produced for these template generating circuits. Thus, stable, highly reliable, and highly sensitive devices can be produced at low cost. Particularly, the pulse generating circuit according to this aspect of the invention can generate differential pulses at high frequency close to the performance limit of the elements, and therefore can offer considerable advantages.

The pulse generating circuit is constituted by CMOS integrated circuits and the like, and can generate pulses as narrow as the operation transition time of the elements. Moreover, the pulse generating circuit in this aspect of the invention can produce differential or IQ pulse signals having less distortion than that of signals from the pulse generating circuit in the related art. Since the pulse generating circuit having this structure is constituted by logic circuits of the CMOS integrated circuits, the pulse generating circuit can operate easily at the maximum speed of the CMOS circuit without increasing operation power. Thus, high-frequency wide-band pulses utilized for UWB communication can be easily generated.

BRIEF DESCRIPTION OF THE DRAWINGS

The invention will be described with reference to the accompanying drawings, wherein like numbers reference like elements.

FIGS. 5A through 5C are circuit diagrams showing a structure of a starting circuit according to the first embodiment.

FIGS. 16A through 16G illustrate pulses used in UWB.

FIG. 20 is a view for explaining pulses to be generated.

DESCRIPTION OF EXEMPLARY EMBODIMENTS

A pulse generating circuit according to each embodiment of the invention is hereinafter described with reference to the drawings.

First Embodiment

Pulse Structure

Initially, pulse waves to be generated are explained with reference to FIG. 20. FIG. 20 shows waveforms of pulse waves to be generated.

The waveforms of pulse waves to be generated involve a pair of waveforms having phases different from one another by 180 degrees as shown in (a) and (b) of FIG. 20, a pair of waveforms having phases different from one another by 90 degrees as, shown in (d) and (e) of FIG. 20, and two pairs of waveforms having phases different from one another by 180 degrees initially but having phases different from one another by 90 degrees at the time of output as shown in (g) through (j) of FIG. 20. In FIG. 20, (a) and (b) show differential output pulse waveform signals, and (c) shows the potential difference between the pulse signals shown in (a) and the pulse signals shown in (b). In FIG. 20, (d) and (e) show single end output I and Q signals. In FIG. 20, (g) through (j) show differential output I and Q signals.

In this embodiment, generation of the following waveforms easily produced by using CMOS (complementary metal oxide film semiconductor) process and having the minimum line width of 0.18μ is discussed as an example. However, the waveforms to be generated are not limited to those. When the pulse interval is $T_P$ (arbitrary value) with the carrier frequency $f_0$=4 GHz as shown in (a) of FIG. 20, half of the carrier wave cycle calculated with Pw=1/(2$f_0$) is Pw=125 psec. In this case, the pulse width $P_D$ is 2×n×$P_W$ (n is an arbitrary cycle). The signal types include differential output, a pair of single end output I and Q signals, and a pair of differential output I and Q signals.

Structure of Pulse Generating Circuit

Figure 1:
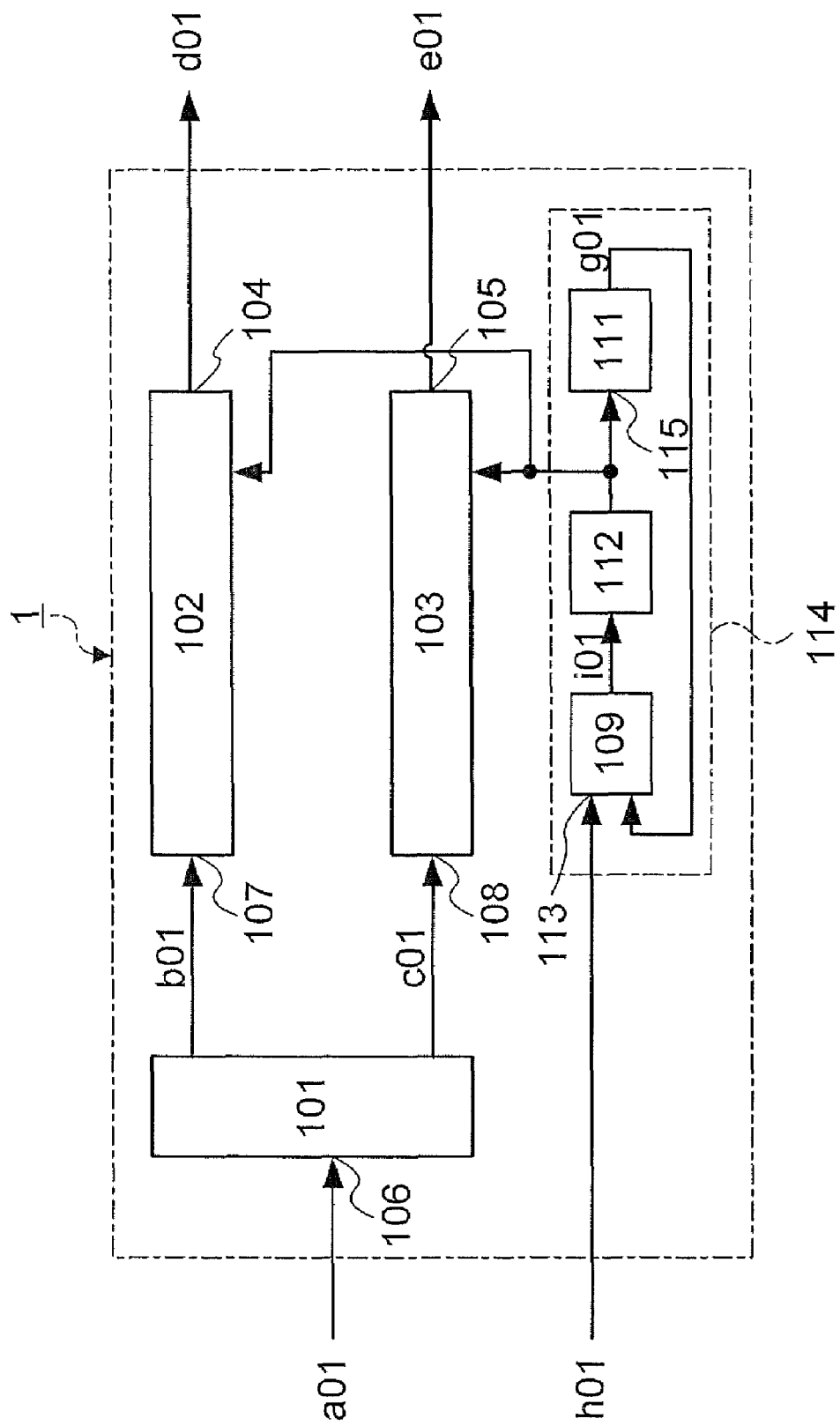
FIG. 1 illustrates a structure of a pulse generating circuit according to a first embodiment.

The structure of the pulse generating circuit according to the first embodiment is now described with reference to FIGS. 1 and 2. FIG. 1 illustrates the structure of the pulse generating circuit in the first embodiment, and FIG. 2 is a timing chart showing the operation of the pulse generating circuit in the first embodiment.

As illustrated in FIG. 1, a pulse generating circuit 1 includes a starting circuit 101, and pulse wave generating sub circuits 102 and 103 for generating pulse waves having the same characteristics. The starting circuit 101 receives a generation starting signal a01 inputted to a pin 106 and generates m=2 starting signals b01 and c01 at predetermined time intervals to output the starting signals b01 and c01 to pins 107 and 108. The pulse wave generating sub circuits 102 and 103 generate pulse waves d01 and e01, respectively, in response to rising of the starting signals b01 and c01 to output the pulse waves d01 and e01 from pins 104 and 105.

Figure 2:
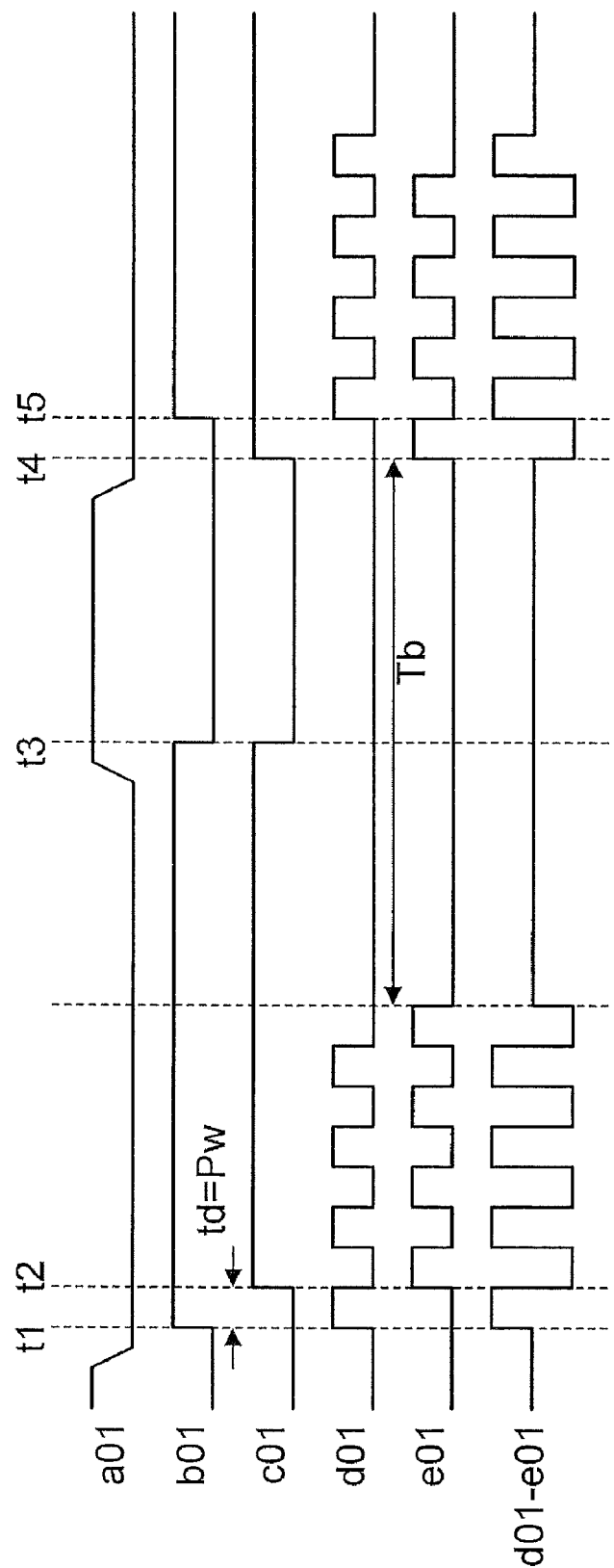
FIG. 2 is a timing chart showing operation of the pulse generating circuit according to the first embodiment.

When a time difference td between the starting signals b01 and c01 is set at the pulse width Pw of generated pulse waves as shown in FIG. 2, the pulse wave generating sub circuits 102 and 103 generate pulse waves d01 and e01 with the time difference equivalent to the pulse width Pw. The potential difference between the pulse waves d01 and e01 has a waveform d01−e01 shown in FIG. 2. The polarity of the generated pulse waves can be reversed by changing the generation order of the starting signals b01 and c01. More specifically, the starting signal b01 is produced at a time t1 shown in FIG. 2, and thus the pulse wave d01 is generated. The starting signal c01 is produced at a subsequent time t2, and thus the pulse wave e01 is generated. The starting signal c01 is produced at subsequent a time t4, and thus the pulse wave e01 is generated. The starting signal b01 is produced at subsequent a time t5, and thus the pulse wave d01 is generated. The polarity of the potential difference between the pulse waves d01 and e01 can be reversed as indicated by the signal d01−e01 shown in FIG. 2.

The pulse wave generating sub circuits 102 and 103 can generate pulse waves either in response to rising of the starting signals b01 and c01, or in response to both falling and rising of those signals d01 and c01.

During the period when neither the pulse wave generating sub circuit 102 nor the pulse wave generating sub circuit 103 generates the pulse waves d01 and e01, that is, during the period indicated by Tb in FIG. 2, the voltage of the signal d01−e01 as the difference between voltages outputted from the pulse wave generating sub circuits 102 and 103 becomes zero at any voltages under the condition in which the voltages outputted from the pulse wave generating sub circuits 102 and 103 are equivalent to each other.

The voltages of the pulse waves d01 and e01 generated from the pulse wave generating sub circuits 102 and 103 are not necessarily zero during the period Tb (=Tp−$P_D$) unlike the case in (a) and (b) in FIG. 20. However, when the signals having the pulse waves d01 and e01 are used as differential signals as indicated by the signal d01−e01 shown in FIG. 2, the waveform becomes equivalent to the waveform of the signal shown in (c) in FIG. 20, allowing a pair of desired pulse waves to be produced. According to the related-art technology, the signals having the offset potential during the period Tb (=TP−$P_D$) as indicated in FIG. 16C are not easily used. However, this offset is cancelled when the signals are used as the differential signal pair as in the first embodiment, and thus can be used as signals easily used. The voltage can be arbitrarily set at a value most preferable for signal generation during the period Tb. Generally, stable pulse signals can be generated by using power supply voltage having the lowest impedance.

According to the pulse generating circuit 1, the two pulse wave generating circuits 102 and 103 having the same characteristics generate signals as the differential signal pair. Thus, the generated signals have equal characteristics and preferable symmetry with less distortion.

According to comparison between the signals shown in FIG. 20 and FIG. 2, the signals shown in FIG. 20 are round, but the signals shown in FIG. 2 are angular. However, the angular shape of the signals in FIG. 2 comes from simplification of the figure, and the signals generated from the pulse wave generating sub circuits 102 and 103 can obtain the waveform shown in FIG. 20 by using circuits for generating round pulse waves. Since the desired pulse waves operate at high speed close to the performance limit of the elements constituting the circuits, round waveform can be automatically outputted in many cases even by digital circuits.

Figure 3:
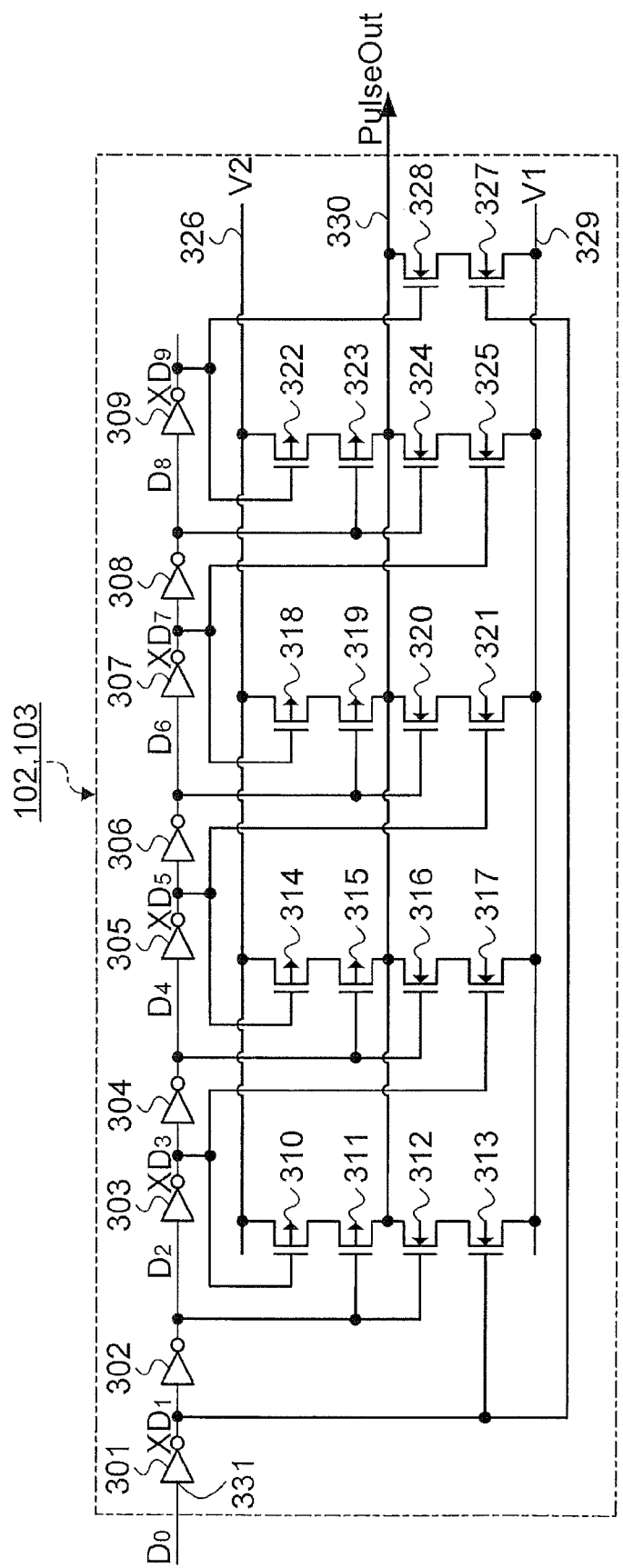
FIG. 3 is a circuit diagram showing a structure of a pulse wave generating sub circuit according to the first embodiment.

The structure and operation of the pulse wave generating sub circuits are now described with reference to FIGS. 3 and 4. FIG. 3 is a circuit diagram showing the structure of the pulse wave generating sub circuit, and FIG. 4 is a timing chart showing the operation of the pulse wave generating sub circuit.

Each of the pulse wave generating sub circuits 102 and 103 includes a plurality of inverter delay circuits 301 through 309, MOS transistors 310 through 325, 278 and 328 as pulse wave generating logic circuits.

Figure 4:
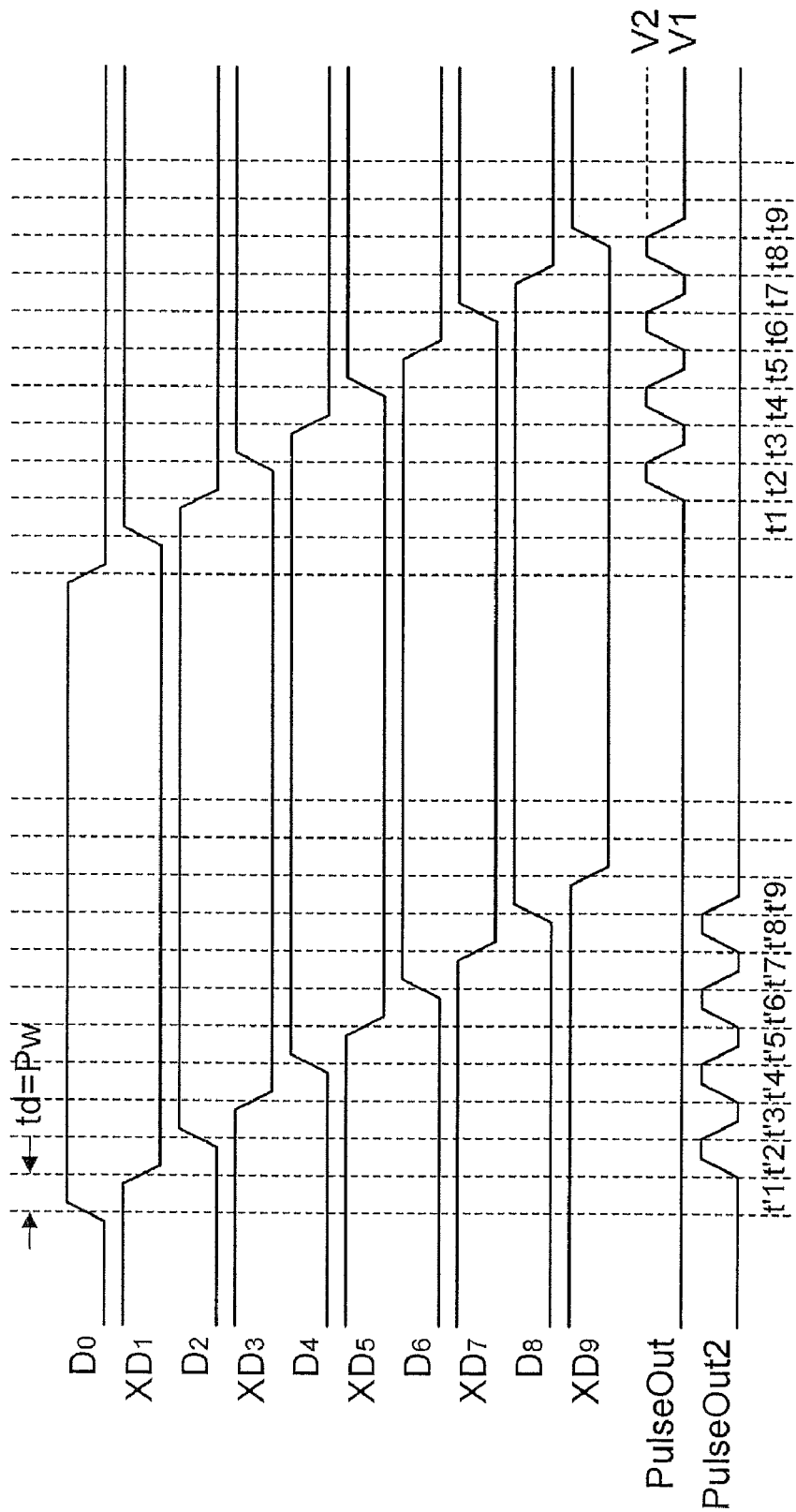
FIG. 4 is a timing chart showing operation the pulse wave generating sub circuit according to the first embodiment.

A starting signal $D_o$ inputted to a pin 331 transmits through the inverter delay circuits 301 through 309 while reversing the phase with the time delay td for each circuit as shown in FIG. 4, and is outputted from each circuit. More specifically, assuming that the signal applied to the pin 331 is positive logic, $XD_i$ (NOT logic) is outputted to ith circuit when i is an odd number. Also, $D_i$ (positive logic) is outputted to the ith circuit when i is an even number.

The N channel MOS transistors 313 and 312 have continuity when output $XD_1$ from the inverter delay circuit 301 and output $D_2$ from the inverter delay circuit 302 are high voltages. Then, the transistors 313 and 312 connect a pulse output pin 330 to a first voltage level V1. The P channel MOS transistors 310 and 311 have continuity when output $D_2$ from the inverter delay circuit 302 and output $XD_3$ from the inverter delay circuit 303 are low voltages. Then, the transistors 313 and 312 connect the pulse output pin 330 to a second voltage level V2.

Similarly, the N channel MOS transistors 316, 317, 320, 321, 324, 325 have continuity when output $XD_{i-1}$ from the i-1th inverter delay circuit (i is two or larger even number) and output $D_i$ from ith circuit are high voltages, and connect the pulse output pin 330 to the first voltage level V1. The P channel MOS transistors 314, 315, 318, 319, 322, and 323 have continuity when the output $D_i$ from ith inverter delay circuit and output $XD_{i+1}$ from the i+1th circuit are low voltages, and connect the pulse output pin 330 to the second voltage level V2.

As a result, a pulse waveform PulseOut shown in FIG. 4 is obtained by this operation. Thus, the pulse wave generating circuits 102 and 103 can generate the pulse waveform of the pulse wave d01 or pulse wave e01 shown in FIG. 2.

A waveform of Pulseout 2 shown in FIG. 4 is the waveform which is used at the time of rising of the starting signal $D_0$ and will be described later. The first voltage level V1 and the second voltage level V2 may be power source voltage VSS on the negative side and power source voltage VDD on the positive side of the integrated circuit constituting the circuit, respectively. However, the voltages levels V1 and V2 may be arbitrarily set at other voltages.

The N channel MOS transistors 327 and 328 have continuity when the outputs $XD_i$ and $XD_9$ are simultaneously high voltages, and connect the pulse output pin 330 to the first voltage level V1. The voltage outputted from the pulse wave generating sub circuits during the period Tb can be established by this operation. The voltage set in this step may be any voltage other than V1. In this example, the voltage V1 is equivalent to the power source voltage VSS on the negative side. Generally, the VSS voltage is set at grounding voltage as the most stabilized voltage. The pulse wave generating sub circuits shown in FIG. 3 can fix the signal voltage at VSS during the period Tb.

Figure 18:
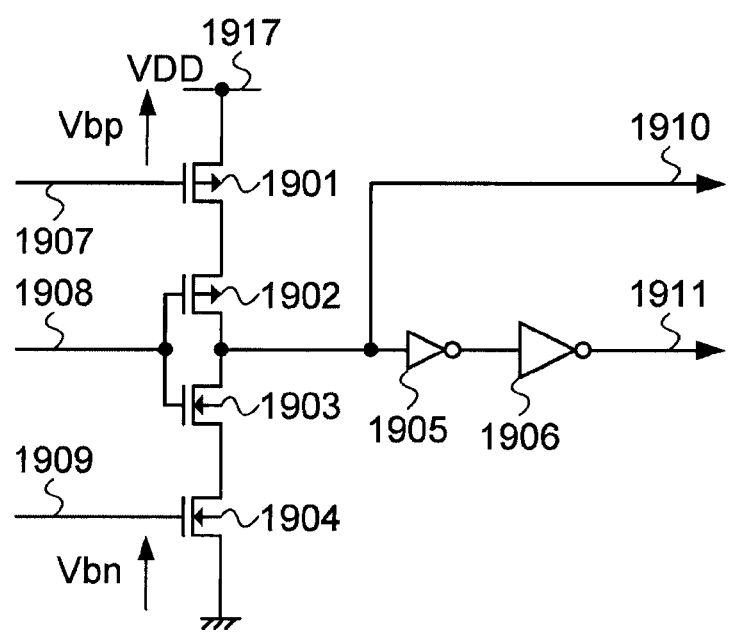
FIG. 18 is a circuit diagram showing the interior of an inverter delay circuit.

FIG. 18 is a circuit diagram showing each internal structure of the inverter delay circuits 301 through 309. P channel MOS transistor 1902 and N channel MOS transistor 1903 constitute the inverter circuit, and a signal inputted to a pin 1908 is reversed and outputted from a pin 1910 with delay time td, and then inputted to the next delay circuit. Thereafter, the signal is extracted via a small buffer circuit 1905 such that the delay of the delay circuits produced by the P channel MOS transistor 1902 and N channel MOS transistor 1903 is not increased, and then an output 1911 is extracted by a buffer circuit 1906. The MOS transistors 310 through 325, 327, and 328 shown in FIG. 3 are operated in this manner. FIG. 3 does not show the buffer circuits 1905 and 1906.

The N channel MOS transistor 1904 is connected between the source pin of the N channel MOS transistor 1903 constituting the inverter delay circuit and a negative power source. The P channel MOS transistor 1901 is connected between the source pin of the P channel MOS transistor 1902 constituting the inverter delay circuit and a positive power source VDD1917.

Source current flowing to the inverter delay circuit can be controlled by controlling gate-source voltages Vbp and Vbn of the P channel MOS transistor 1901 and the N channel MOS transistor 1904. Generally, the gate-source voltages Vbp and Vbn are controlled such that their absolute values become equivalent to each other for maintaining symmetry between rising and falling of the delay circuit output. This control allows control over the operation speed of the inverter delay circuit, thereby controlling the delay time td. Pulses having desired frequency spectrum can be generated by controlling voltages of gate pins 1907 and 1909 such that the relation $P_W$=td holds.

FIG. 1 shows a specific method for controlling the current limit transistor such that correspondence with the carrier wave frequency $f_0$ of the generated pulse waves can be achieved as well. A phase fixing loop 114 has a phase comparing circuit 109, a low pass filter 112, and a voltage control generating circuit 111. The phase comparing circuit 109 compares the phase of a generation frequency of an output signal g01 of the voltage control generating circuit 111 and the phase of a reference frequency of a reference signal h01 applied to a pin 113, and outputs a comparison result signal i01. The low pass filter 112 removes a high-band component from the comparison result signal i01, and negatively returns the resultant component to a control voltage pin 115 of the voltage control generating circuit 111. The phase fixing loop 114 controls such that the reference frequency and the generating frequency of the voltage control generating circuit 111 coincide with each other. The phase fixing loop 114 can freely set the generating frequency of the voltage control generating circuit 111 by providing an appropriate dividing circuit between the voltage control generating circuit 111 and the phase comparing circuit 109 or by controlling the reference frequency. The voltage control generating circuit 111 is constituted by inverter delay circuits having the same characteristics of those of the inverter delay circuits 301 through 309 constituting the pulse wave generating sub circuits 102 and 103, and produces a ring generating circuit by connecting the odd-number of the inverter delay circuits of the pulse wave generating sub circuits 102 and 103 in a ring shape, for example. Under the phase fixing condition achieved by the phase fixing loop 114, the delay of the inverter delay circuit accurately coincides with the period divided by the generating cycle of the voltage control generating circuit 111 (twice larger than the number of circuits).

As illustrated in FIG. 1, the delays of the inverter delay circuits constituting the voltage control generating circuit 111 and the inverter delay circuits 301 through 309 contained in the pulse wave generating sub circuits 102 and 103 can be equivalent to one another by applying the same voltages to the control voltage pin 115 of the voltage control generating circuit 111 and the delay control pins (gate pins 1907 and 1909 in FIG. 18) of the inverter delay circuits 301 through 309 of the pulse wave generating sub circuits 102 and 103. The delay of the delay circuit included in the voltage control generating circuit 111 constituting the phase fixing loop 114 can be freely set by controlling the reference frequency. Thus, the reference frequency is determined such that the delay becomes a necessary delay. The phase fixing loop 114 always operates in such a manner as to achieve correspondence with a predetermined value established by the reference frequency even under the condition subject to fluctuation in source voltage, temperature change, and variation in manufacture process. Accordingly, pulse waves having the constant carrier wave frequency $f_0$ can be generated regardless of the conditional changes such as fluctuation in source voltage, temperature change, and variation in manufacture process.

Figure 6:
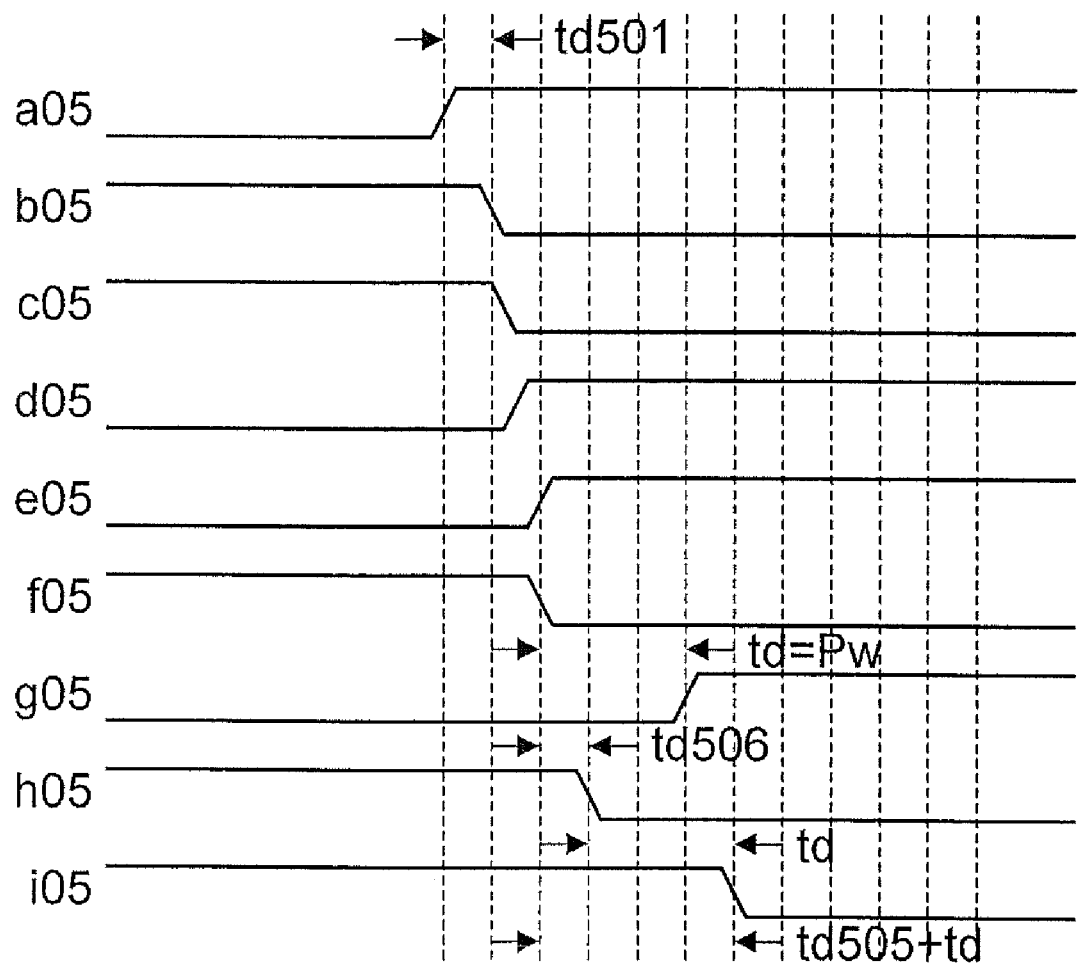
FIG. 6 is a timing chart showing operation of the starting circuit according to the first embodiment.

Structure and operation of a starting circuit is now described with reference to FIGS. 5A through 5C and FIG. 6. FIGS. 5A through 5C are circuit diagrams showing the structure of the starting circuit, and FIG. 6 is a timing chart of the operation of the starting circuit.

As illustrated in FIGS. 1 and 2, a starting circuit 101 is required to generate the two starting signals b01 and c01 with a time difference which accurately corresponds to Pw (i.e., half of cycle of carrier wave frequency $f_o$) in response to the generation starting signal a01 inputted to the pin 106, and input the starting signals b01 and c01 to the pulse wave generating sub circuits 102 and 103. Since Pw corresponds to the delay time td of the inverter delay circuits 301 through 309 constituting the pulse wave generating sub circuits 102 and 103, it is possibly considered that the starting signals b01 and c01 can be easily generated by using one inverter delay circuit 520 providing the same performance as those of the inverter delay circuits 301 through 309 constituting the pulse wave generating sub circuits 102 and 103 as illustrated in FIG. 5B. More specifically, signals having the time td can be produced by receiving a generation starting signal a25 inputted to a pin 521 and outputting the generation starting signal a25 as a starting signal b25 from a pin 522 without change, and also by delaying the generation starting signal a25 by the time td through the inverter delay circuit 520 and outputting the resultant signal as a starting signal c25 from a pin 523. However, the logic of the starting signals b25 and c25 thus produced is reversed by the operation of the inverter delay circuit 520. The pulse wave generating sub circuits 102 and 103 having the same characteristics need to be started by starting signals having the same phase, and thus the circuit shown in FIG. 5B does not constitute a pulse generating circuit providing preferable performance.

For overcoming the problem arising from the starting circuit shown in FIG. 5B, the starting circuit 101 shown in FIG. 5A is now proposed. The starting circuit 101 shown in FIG. 5A produces two signals e05 and f05 each of which simultaneously rises or falls. In this case, the signal f05 of the two signals is delayed by the time td by using the one inverter delay circuit 504 providing the same performance as those of the inverter delay circuits 301 through 309 constituting the pulse wave generating sub circuits 102 and 103, and reversed by the operation of the buffer circuit 505. By using this structure, a pair of starting signals h05 and i05 having the same phase (polarity) and time difference which accurately corresponds to the time td are generated.

For executing this operation, the starting circuit 101 shown in FIG. 5A has the following structure. An inverter 501 produces a signal b05 having the reversed phase of that of a starting signal a05 inputted to a pin 511. As illustrated in FIG. 6, the signal b05 has a delay time td501 produced by the inverter 501 with respect to the starting signal a05. This slight time difference td501 between the two signals produced by the delay of the inverter 501 can be corrected by a correcting circuit 502. That is, the signals a05 and b05 are buffer-amplified by inverter circuits 512 and 513, respectively. The outputs of the inverter circuits 512 and 513 are connected with each other by cross couple inverters 514 and 515. At the time of signal transition, the changes of the signals are mutually emphasized by positive returning operations of the cross couple inverters 514 and 515 such that the slight time difference can be corrected. The signals e05 and f05 capable of achieving precisely simultaneous rising and falling can be generated by connecting the plural correcting circuits 502 in line. FIG. 5A shows two correcting circuits 502 and 503 connected in line as an example.

The signal f05 of the pair of signals e05 and f05 capable of achieving accurately simultaneous rising and falling thus produced is further inputted to the inverter delay circuit 504 to be delayed by the time td and reversed in polarity The buffer circuits 505 and 506 apply buffer-amplification having the same characteristics. The buffer circuits 505 and 506 are connected to control the delay of the inverter delay circuit 504 such that this delay becomes equivalent to those of the inverter delay circuits 301 through 309 constituting the pulse wave generating sub circuits 102 and 103, and that output load becomes equivalent to those of the inverter delay circuits 301 through 309. As illustrated in FIG. 3, a buffer circuit 1905 for operating the next inverter delay circuit and the MOS transistors 310 through 325 as loads is connected to the inverter delay circuits 301 through 309 of the pulse wave generating sub circuits 102 and 103 to input signals to the next circuit (this buffer circuit is not shown in FIG. 3). A bi-phase signal generating circuit 519 is constituted by the inverter 501, the correcting circuits 502 and 503, the inverter delay circuit 504, and the buffer circuits 505 and 506.

As shown in detail in FIG. 18, each of the inverter delay circuits 301 through 309 is directly connected to the next inverter delay circuit through a pin 1910 without intervention of buffer, and connected to the MOS transistors 310 through 325 via the buffer circuit 1905 having small driving capability and a buffer circuit 1906 having larger driving capability to obtain desirable amplified driving capability. When loads connected to the inverter delay circuit 504 are not equivalent to inputs to the next inverter delay circuit and the small buffer circuit 1905 for extracting signals, the delay of the inverter delay circuit 504 is not equalized with the delay of the inverter delay circuits constituting the pulse wave generating sub circuits. Thus, input impedance of the buffer circuit 505 is controlled such that the load of the inverter delay circuit 504 can be equalized with the sum of the loads of the next inverter delay circuit and the buffer circuit 1905. It is possible to connect a dummy load corresponding to input impedance of the buffer circuit 505 identical to the buffer circuit 1905 shown in FIG. 18 and the next inverter delay circuit to the output of the inverter delay circuit 504. The buffer circuit 506 is connected to secure the delay time of the buffer circuit 505.

By this method, the signals e05 and f05 which simultaneously rise and fall obtain a signal h05 delayed by a delay time td506 by the buffer circuit 506 and a signal i05 delayed by a delay td505+td as the sum of the delays by the inverter delay circuits 504 and the buffer circuit 505, respectively as shown in FIG. 6. While the signal h05 is a signal produced by reversing the signal e05, the signal i05 is a signal produced by reversing the signal f05 twice and thus having the same polarity. Since the signals e05 and f05 simultaneously change and have reversed polarities, the signals h05 and i05 have the same polarity with time difference td505+td−td506. When the buffer circuits 506 and 505 having the same characteristics are used under the same environment including the applied loads, td505 becomes equivalent to td506. Accordingly, the signals h05 and i05 having the same characteristics and the time difference td are obtained.

AND-OR select circuits 507 and 508 change output targets of the signals h05 and i05. Pins 516 and 517 are output pins of the pair of the starting signals, and correspond to the pins 107 and 108 shown in FIG. 1. When a signal k05 applied to the pin 510 is true (H: high level), the signal h05 is connected to the pin 517. When the signal k05 is false (L: low level), the signal h05 is oppositely connected. The order of the two starting signals b01 and c01 to be generated can be switched by the signal k05 inputted to the pin 510 as illustrated in FIG. 2, and the polarity of the generated signals can be changed as indicated by the signal d01–e01 shown in FIG. 2. Bi-phase modulation can be applied to the generated pulse waves by using the pin 510, which therefore can be used as a modulator of the UWB transmitting device. A starting signal selecting circuit 518 is constituted by the buffer circuit 509 and the AND-OR select circuits 507 and 508.

The circuit for performing modulation may be disposed on the output sides of the two pulse wave generating sub circuits 102 and 103. More specifically, a switch circuit 529 as an output selection circuit shown in FIG. 5C is disposed behind the pins 104 and 105 shown in FIG. 1 and connected with pins 525 and 526 to extract signals from pins 527 and 528. A switch circuit 529 having switches 531 through 534 changeable according to an electric signal m05 applied to a pin 530 is provided between the pairs of the pins 525 through 528 to change the output targets and switch the polarities of the signals. The switches 531 through 534 may be complementary MOS analog switches, for example. This structure requires more attention to the design of the output side circuit than the structure which switches on the input side since the impedances of the switches are arranged in series on the output side. However, the two pulse wave generating sub circuits 102 and 103 and the starting circuit 101 for starting these circuits are directly connected without switching unlike the structure switching on the input side. Thus, the operation of the starting circuit 101 is more stabilized, and accurate pulse generation can be easily achieved. Either of the structures can be selected according to the situation.

According to this embodiment, the following advantages are offered.

(1) According to this structure, differential pulse waves having stabilized DC level and preferable symmetry can be generated by using the plural pulse wave generating sub circuits having the same characteristics and controlling the starting time of the respective pulse wave generating sub circuits. Differential signals having different phases by 180 degrees can be produced by setting the predetermined time intervals of m starting signals at a period equivalent to the pulse width Pw of the pulse waves. The I and Q signals having different phases by 90 degrees can be generated by setting the time intervals at half of the width Pw.

(2) The pulse wave generating sub circuits (102, 103) are constituted by the inverter delay circuits 301 through 309 produced by normal semiconductor process and the pulse wave generating logic circuits (MOS transistors 310 through 325 and 327 and 328). Thus, the pulse wave generating sub circuits (102, 103) can be highly integrated.

(3) The pulse wave generating sub circuits (102, 103) which generate pulse waves at the time intervals equivalent to the pulse width Pw can generate two signals having different phases by 180 degrees. The pulse waves generated by the pulse wave generating sub circuits having the same characteristics are differential pulse waves having stabilized DC level and preferable symmetry.

(4) The starting circuit 101 generates two phases of starting signals at the time intervals corresponding to the delay of the inverter delay circuits 301 through 309 constituting the pulse wave generating sub circuits (102, 103) by the function of the bi-phase signal generating circuit 519. Thus, the time interval of the starting signal for starting the pulse wave generating sub circuits (102, 103) accurately coincides with the pulse width Pw of the pulse waves generated by the pulse wave generating sub circuits (102, 103).

(5) The starting circuit 101 which applies modulation based on the phase of the data transmitted by the starting signal selecting circuit 518 can be used as a pulse generating circuit appropriate for UWB communication.

(6) The pulse generating circuit 1 having the switch circuit 529 can apply modulation based on the phase of the transmitted data, and therefore can be used as a pulse generating circuit appropriate for UWB communication.

(7) The inverter delay circuits 301 through 309 control the delay of the inverter delay circuits according to outside control signals. Thus, fluctuations in generated pulses and errors caused by manufacture variation and fluctuations in operation temperature and source voltage can be corrected.

Second Embodiment

A pulse generating circuit according to a second embodiment is now described. In the first embodiment, the two pulse wave generating sub circuits need to output signals from the respective circuits with accurate time delay of the time td. Without the accurate time delay of td, the outputted pulse signals produce errors. The inverter delay circuits constituting these pulse wave generating sub circuits cause small delay errors produced by manufacture variation or delay errors produced by noise such as jitter. However, these errors can be reduced by the method according to the second embodiment.

Figure 7:
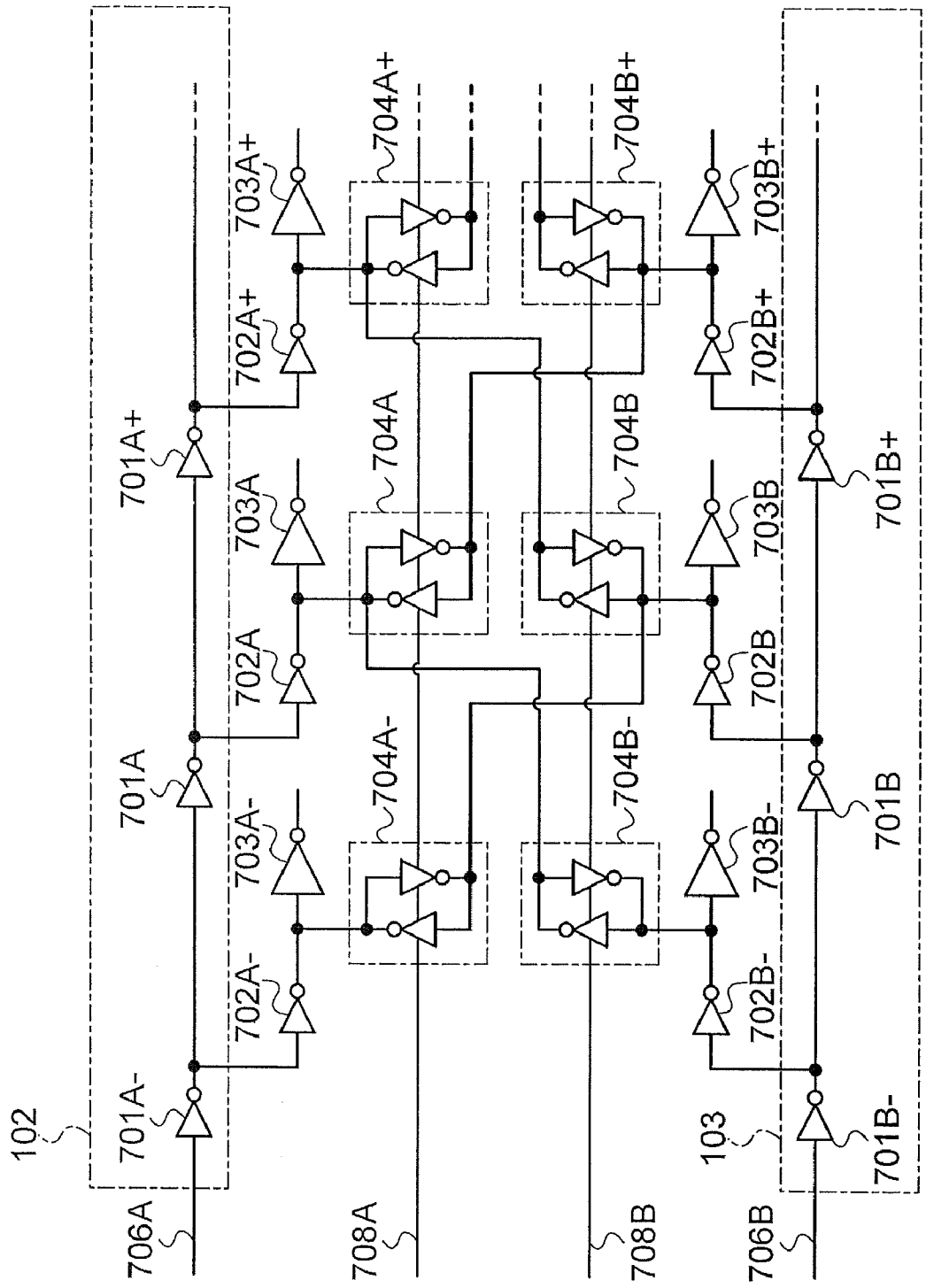
FIG. 7 is a circuit diagram showing a structure of a pulse generating circuit according to a second embodiment.

The structure of the pulse generating circuit according to the second embodiment is now described with reference to FIG. 7. FIG. 7 is a circuit diagram showing the structure of the pulse generating circuit in the second embodiment. FIG. 7 shows inverter delay circuits 701A−, 701A, and 701A+ as a part of the pulse wave generating sub circuit 102 shown in FIG. 1, i.e., three successive circuits of a series of the inverter delay circuits 301 through 309 contained in the pulse wave generating sub circuit 102 shown in FIG. 3, and does not show other circuits. Similarly, FIG. 7 shows inverter delay circuits 701B−, 701B, and 701B+ as a part of the pulse wave generating sub circuit 103 shown in FIG. 1, i.e., three successive circuits of a series of the inverter delay circuits 301 through 309 contained in the pulse wave generating sub circuit 103 shown in FIG. 3, and does not show other circuits. When j is an integer in the range of $2 \leq j \leq 8$, these inverter circuits correspond to the j−1th, jth, and j+1th inverter delay circuits from the left in FIG. 3. Buffer circuits 702A−, 702A, 702A+, 702B−, 702B, and 702B+ having small driving capability are circuits for extracting signals with smallest possible effect on the delay of the respective inverter delay circuits. Buffer circuits 703A−, 703A, 703A+, 703B−, 703B, and 703B+ having large driving capability are circuits for driving switches (drivers).

The inverter delay circuits 701A−, 701A, and 701A+ (hereinafter referred to as A line) and 701B−, 701, and 701B+ (hereinafter referred to as B line) are started with the delay time td of these inverter delay circuits. Thus, the signal of the jth inverter in the A line and the signal of the j−1th circuit in the B line simultaneously change in such a manner as to be mutually reversed when the A line is initially started. On the contrary, the signal of the jth inverter in the B line and the signal of the j−1th circuit in the A line simultaneously change in the opposite directions (reverse directions) when the B line is initially started.

The signals mutually reversed in the opposite directions and having small timing difference can be corrected by the cross couple inverter as described with reference to FIGS. 5A through 5C.

When the A line is initially started under the condition in which the cross couple inverters 704A−, 704A, and 704A+, and 704B−, 704B, and 704B+ having enable signal pins are connected in the manner shown in FIG. 7, an enable signal is given to an enable signal pin 708B to enable the cross couple inverters 704B−, 704B, and 704B+ having enable signal pins.

Also, a disable signal is inputted to an enable signal pin 708A to disable the cross couple inverters 704A−, 704A, and 704A+ having enable signal pins. When the B line is initially started, an enable signal is given to the enable signal pin 708A to enable the cross couple inverters 704−, 704A, and 704A+ having enable signal pins. Also, a disable signal is inputted to the enable signal pin 708B to disable the cross couple inverters 704B−, 704B, and 704B+ having enable signal pins.

By this connection, the cross couple inverter is connected to a node at which signals simultaneously change at all times. In this case, small phase shift can be corrected, and the switching timing of the MOS transistors 310 through 325 connected to the subsequent circuit agrees with one another. Accordingly, errors in the produced pulse waveforms can be extremely reduced.

In the example shown in FIG. 7, the cross couple inverters 704A−, 704A, and 704A+, and 704B−, 704B, and 704B+ having enable signal pins are connected between the outputs of the buffer circuits 702A−, 702A, and 702A+, and 702B−, 702B, and 702B+ having small driving capacity. However, these cross couple inverters may be connected to the outputs of the inverter delay circuits 701A−, 701A, and 701A+, and 701B−, 701B, and 701B+. In this case, the delay of the inverter delays circuits increases and thus these delay circuits are difficult to use when pulses having the pulse width close to the element limitation are generated, but delay errors of the inverter delay circuits can be corrected as well. Since correction is made for each inverter delay circuit, transmission of errors to the inverter delay circuit disposed downstream in the line can be prevented. Accordingly, more accurate pulse generation can be achieved.

When the switch circuit 529 shown in FIG. 5C in the first embodiment is connected as a modulating circuit system in the second embodiment, cross couple inverters having no enable signal pin can be used instead of the cross couple inverters having enable signal pins. In this case, the cross couple inverters in either the A line or the B line can be eliminated.

The pulse generating circuit in the second embodiment is characterized in that the predetermined pair of the pulse wave generating sub circuits are connected between output nodes at which the phases of the outputs of the inverter delay circuits constituting the pulse wave generating sub circuits are mutually reversed.

Third Embodiment

A pulse generating circuit according to a third embodiment is now described.

Figure 8A:
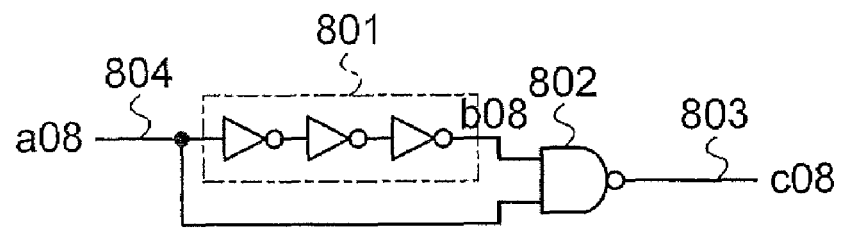
FIGS. 8A and 8B are circuit diagram and timing chart of a structure of a circuit for limiting pulse width of a generation starting signal generated from a pulse generating circuit according to a third embodiment.
Figure 8B:
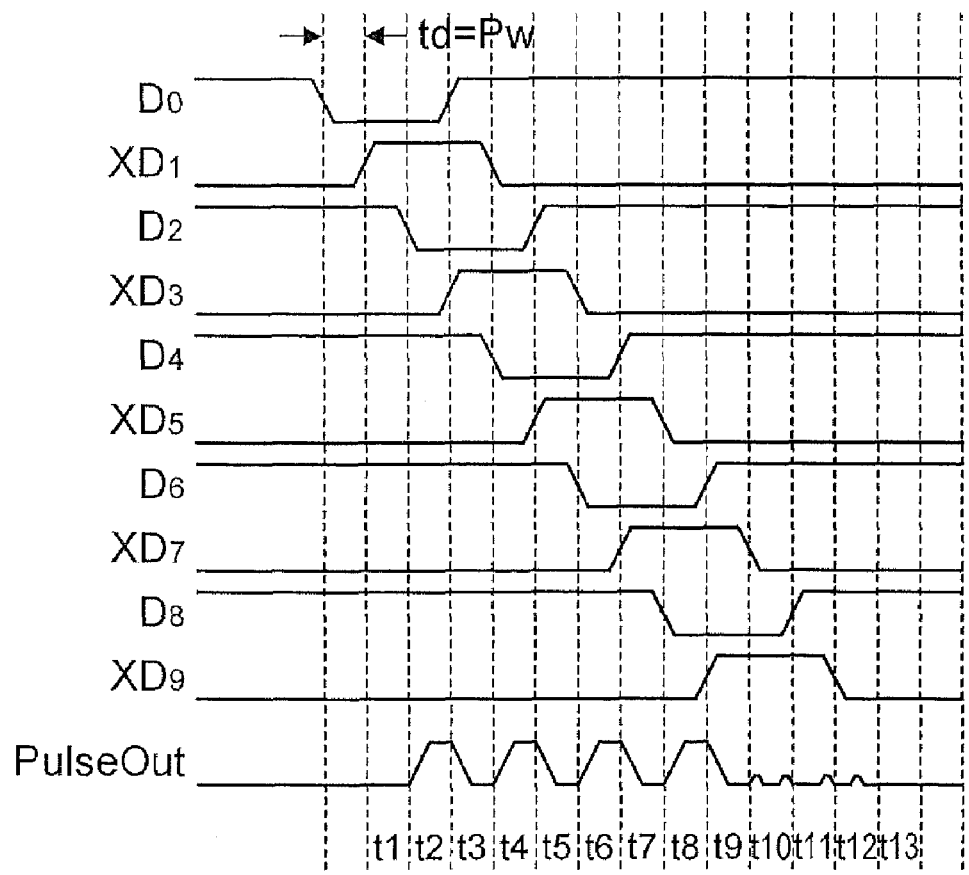

The structure of the pulse generating circuit according to the third embodiment is described with reference to FIGS. 8A and 8B. FIGS. 8A and 8B are circuit diagram of a circuit which limits pulse width of generation starting signals from the pulse generating circuit according to the third embodiment, and a timing chart, respectively.

FIG. 8A illustrates the circuit for limiting pulse width of generation starting signals, and generation starting signals having limited pulse width are outputted from an output pin 803. The output pin 803 is connected to the pin 106 shown in FIG. 1 or the pin 511 shown in FIG. 5A. A delay circuit 801 includes three inverter delay circuits connected in line each of which has the same characteristics as those of the inverter delay circuits 301 through 309 constituting the pulse wave generating sub circuits 102 and 103, for example. A NAND circuit 802 calculates NOT-AND of a signal a08 inputted to a pin 804 and a signal b08 as a signal produced by reversing and delaying the signal a08 by the delay circuit 801 to generate a signal c08 having the limited pulse width of 3×td and output the signal c08 from the output pin 803 (td: delay time of inverter delay circuits constituting pulse wave generating sub circuit). When the signal c08 outputted from the output pin 803 is used as the generation starting signal, the pulse wave generating sub circuits 102 and 103 operate in the manner shown in FIG. 8B. In this case, rising of the starting signal $D_0$ overlaps with the period t2-t3 of the pulse waveform PulseOut generated initially. The waveform of the signal $D_0$ at node in FIG. 8B corresponds to that of the signal $D_0$ in FIG. 4, and the waveform of the signal $XD_1$ at node in FIG. 8B corresponds to that of the signal $XD_1$ in FIG. 4. Similarly, the waveform of the signal $XD_9$ at node in FIG. 8B corresponds to that of the signal $XD_9$ in FIG. 4.

Figure 19A:
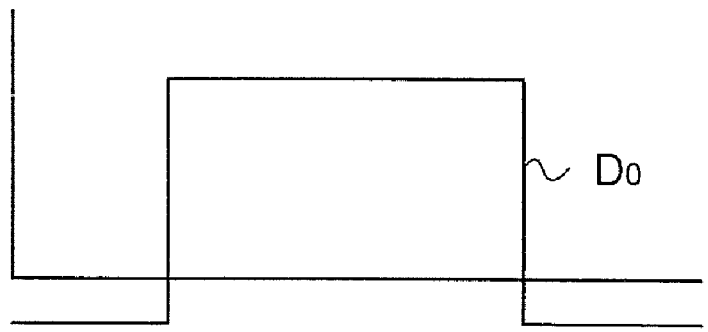
FIGS. 19A through 19D illustrate problems arising from a pulse generating circuit in related art.
Figure 19B:
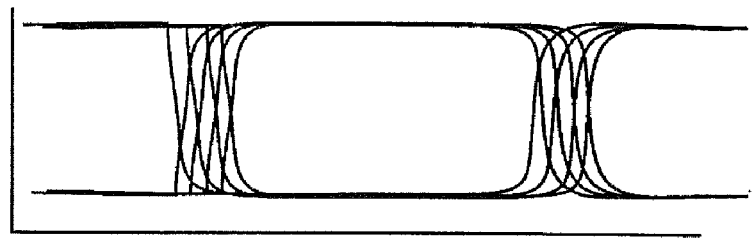
Figure 19C:
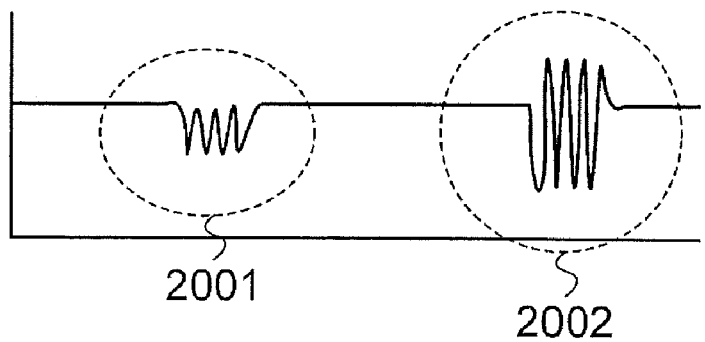
Figure 19D:
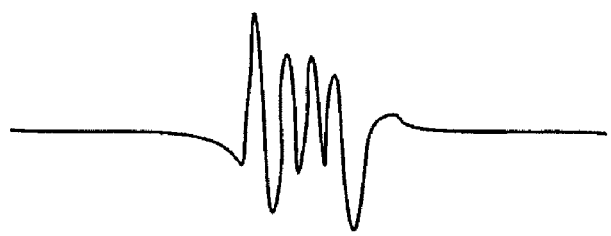

When the pulse width of the generation starting signal is reduced by the operation discussed above, a noise 2001 generated at an undesired position shown in FIG. 19C overlaps with a desired pulse 2002. In FIG. 8B, a period t1-t8 corresponds to a generation period of the desired pulse, and a period t4-t12 corresponds to a generation period of a false pulse generated by rising of the starting signal $D_0$. In this case, the most part of the false pulse is covered by the desired pulse, and thus the noise generated at the undesired position can be reduced.

The circuits do not operate when the pulse width of the generation starting signal is td or smaller. The pulse width of the generation starting signal needs to exceed td and to be smaller than the continuation period of the desired pulse. The continuation period of the pulse is p times longer than td (p corresponds to the number of inverter delay circuits constituting pulse wave generating sub circuit). A larger part of the false pulse is covered by the desired pulse as the pulse width becomes narrower.

The effect of noise generated at the undesired position can be reduced by the simple method discussed above, that is, by setting the pulse width of the generation starting signal to be inputted to the starting circuit at a value larger than the delay of the delay circuits constituting the pulse wave generating sub circuit and smaller than the delay multiplied by the number of the delay circuits.

Fourth Embodiment

A pulse generating circuit according to a fourth embodiment is now described.

The structure of the pulse generating circuit in the fourth embodiment is described with reference to FIGS. 9A through 9D. FIGS. 9A through 9D are circuit diagrams showing another method for generating a starting signal to be given to a starting circuit of the pulse generating circuit in the fourth embodiment.

When the starting signal $D_0$ is started not by a single pulse but by a cyclic signal in FIG. 8B, the pulse generating circuit successively generates short pulses. The pulse frequency thus generated can be increased to a high frequency close to the limit of the circuit elements.

It is considered that intermittent pulses are sufficient for UWB communication, but this system can perform synchronous capturing operation and the like at high speed when successive pulses are used. Thus, it is preferable that both successive and intermittent pulses can be generated according to the situation.

It is easily understood that the cycle of the generation starting signal needs to be the time td multiplied by an even number and equal to or smaller than the time td multiplied by n. When the cycle is longer than this range, pulses to be generated do not continue. In case of the cycle as the time td multiplied not by an even number but by an odd number, the P channel MOS transistors 310, 311, 314, 315, 318, 319, 322, and 323, and the N channel MOS transistors 312, 313, 316, 317, 320, 321, 324, and 325 are simultaneously turned on in FIG. 3. In this case, a timing which causes short-circuit between the voltages V1 and V2 exists.

Figure 9A:
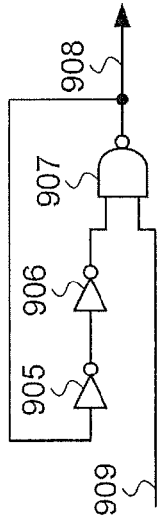
FIGS. 9A through 9D are circuit diagrams showing another method for generating a starting signal to be given to a starting circuit of a pulse generating circuit according to a fourth embodiment.

The cycle of the generation starting signal needs to be accurately equivalent to the td multiplied by an even number. For generating pulses having this accurate cycle, a ring generating circuit shown in FIG. 9A is used. This ring generating circuit has inverter delay circuits 901, 902, and 903 having the same characteristics as those of the inverter delay circuits 301 through 309 constituting the pulse wave generating sub circuits 102 and 103 connected in a ring shape as a generating circuit. FIG. 9A shows three inverter delay circuits as an example. The generation cycle of the structure having three inverter delay circuits is 6×td. More precisely, the delay time of the inverter delay circuits at rising is different from that at falling. However, the delay time of the inverter delay circuits is required to be equal at both rising and falling so as to constitute the pulse wave generating sub circuits 102 and 103. Thus, the delay time is td at both rising and falling according to the cycle calculation described above. A CMOS circuit can control the symmetry between rising and falling by controlling the sizes of the P and N channel transistors.

Figure 9B:
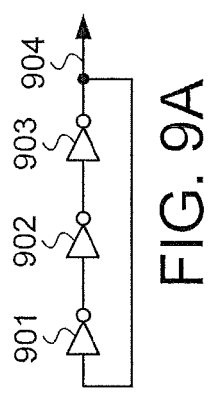

The ring generating circuit shown in FIG. 9A generates pulses by self operation, and cannot achieve synchronism by trigger from the outside. FIG. 9B shows a ring generating circuit which can attain synchronism by starting operation from the outside.

The ring generating circuit shown in FIG. 9B has inverter delay circuits 905 and 906 and a NAND gate 907. The NAND gate 907 constantly outputs true (H) level when a starting pin 909 is at false (L) level, and the circuit stops operation in this condition. The NAND gate 907 starts operation as an inverter when the starting pin 909 is at H level, and initiates generation in synchronization with rising of the starting pin.

Figure 9D:
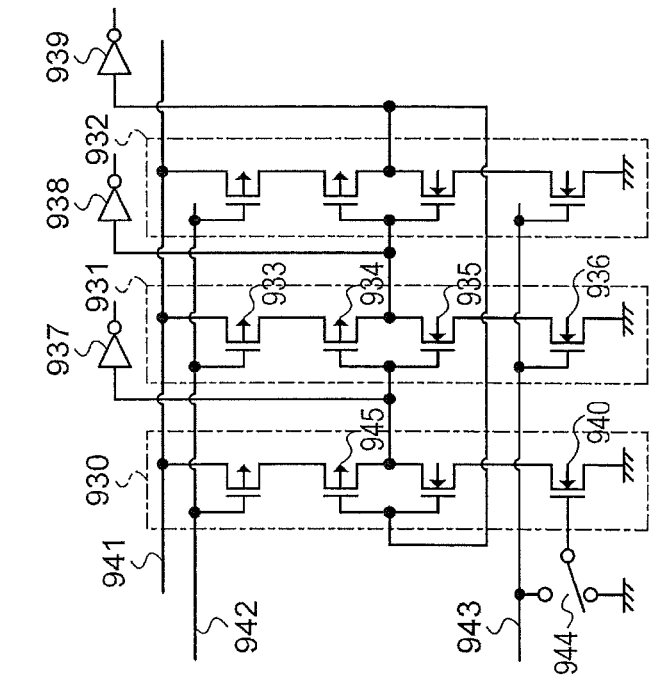
Figure 9C:
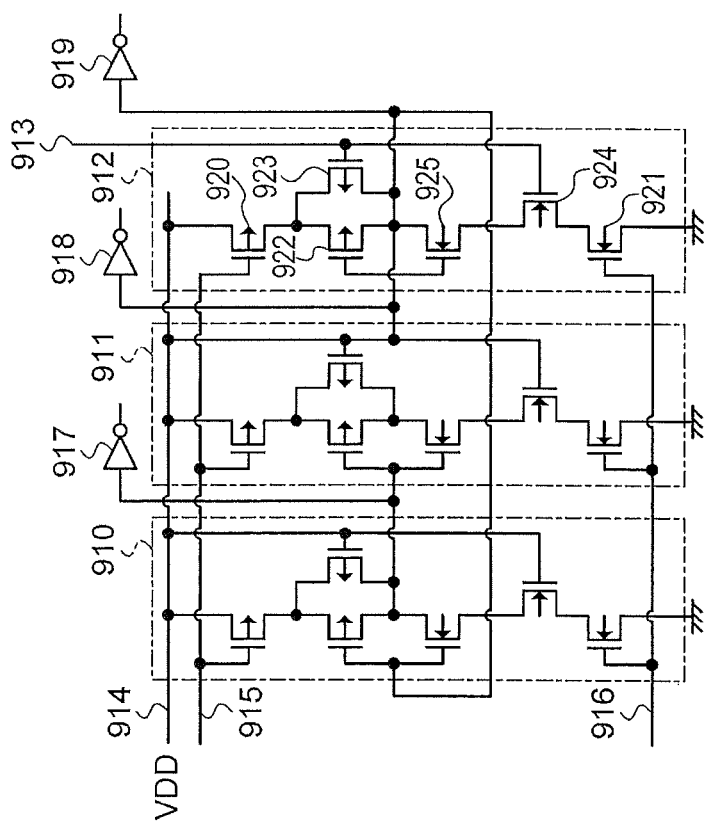

According to the ring generating circuit shown in FIG. 9B which contains the NAND gate, it is difficult to set the generation cycle accurately at the time td multiplied by an even number. FIG. 9C shows a method for solving this problem.

A ring generating circuit shown in FIG. 9C has NAND gates 910, 911 and 912 in place of the inverter delay circuits 905 and 906 shown in FIG. 9B. Since the NAND gates 910, 911 and 912 have the same structure, only the internal structure of the NAND gate 912 is now explained as an example. The NAND gate 912 has P channel MOS transistors 922 and 923 and N channel MOS transistors 924 and 925. For limiting current, a P channel MOS transistor 920 is provided between the sources of the P channel MOS transistors 922 and 923 and a power source VDD 914, and an N channel MOS transistor 921 is connected between the source of the N channel MOS transistor 924 and a grounding voltage. Voltages are applied from the outside to the gates of the P channel MOS transistor 920 and the N channel MOS transistor 921 via pins 915 and 916 to control the operation speed of the NAND gates 910 through 912. Buffer circuits 917, 918, and 919 are connected to extract signals to the outside.

One of the input pins of each of the NAND gates 910 and 911 in the ring generating circuit shown in FIG. 9C is connected to the power source VDD 914 such that this input pin is constantly at H level. Thus, the NAND gates 910 and 911 can operate as inverter delay circuits. When the inverter delay circuits constituting the pulse wave generating sub circuits are replaced with inverter delay circuits containing NAND gates, the time td of the delay circuits accurately agrees with one another.

When NOR gates are used in place of the NAND gates in the ring generating circuit shown in FIG. 9C by replacing the P channel MOS transistors and N channel MOS transistors, similar operations can be performed.

While the ring generating circuit shown in FIG. 9C has the advantage that only logic circuits are used, the number of the necessary transistors slightly increases. FIG. 9D shows a method for solving this problem.

The ring generating circuit shown in FIG. 9D can achieve synchronism by using inverter delay circuits 930, 931, and 932. The inverter delay circuits 930, 931, and 932 have the same characteristics as those of the inverter delay circuits 301 through 309 constituting the pulse wave generating sub circuits 102 and 103. For avoiding repeated explanation, only the internal structure of the inverter delay circuit 931 is discussed as an example. A P channel MOS transistor 934 and an N channel MOS transistor 935 constitute inverter in the inverter delay circuit 931. For limiting current, a P channel MOS transistor 933 is provided between the source of the P channel MOS transistor 934 and a power source VDD 941, and an N channel MOS transistor 936 is connected between the source of the N channel MOS transistor 935 and a grounding voltage. Voltages are applied from the outside to the gates of the P channel MOS transistor 933 and the N channel MOS transistor 936 via pins 942 and 943 to control the operation speed of the inverter delay circuits 930, 931, and 932. Buffer circuits 937, 938, and 939 are connected to extract signals to the outside.

The ring generating circuit shown in FIG. 9D changes control voltage given to the transistor for limiting current contained in any one of the inverter delay circuits (at least one of the P and N channel MOS transistors) by using a switch 944. FIG. 9D shows a structure in which control voltage given to the gate of the N channel MOS transistor 940 for limiting current in the inverter delay circuit 930 is changed by using the switch 944. The N channel MOS transistor 940 is turned off when the voltage applied to the gate of the N channel MOS transistor 940 is switched from the voltage of the pin 943 to the grounding voltage by the switch 944. In this case, the output to the inverter delay circuit 930 is at H level. Thus, the output from the inverter delay circuit 931 is at L level at this time, and the output from the inverter delay circuit 932 is at H level at which the circuit stops. When voltage of the pin 943 is applied to the gate of the N channel MOS transistor 940 by using the switch 944, the circuit simultaneously produces a ring generating circuit and starts pulse generation.

According to the ring generating circuit shown in FIG. 9D, attention needs to be given to the timing of changing the switch 944. As discussed above, the inverter delay circuits 930, 931, and 932 output H, L, and H levels, respectively, when the N channel MOS transistor 940 is turned off. When the output from the inverter delay circuit 932 is H level, the transistor 945 is also turned off. In this case, the inverter delay circuit 930 is in floating condition. The input voltages to the inverter delay circuits 931 and 932 and the buffer circuits 937, 938, and 939 are not determined when the inverter delay circuit 930 is not switched at the timing accurately at H level of the output. In this case, current leak may be caused. When the transistor 940 is turned off at the timing when the output from the inverter delay circuit 930 accurately becomes H level, the transistor 945 is turned off after elapse of the delay time of the inverter delay circuits 931 and 932. During this period, charges are stored in a small capacity interposed between the output node of the inverter delay circuit 930 and the input nodes of the buffer circuit 937 and the inverter delay circuit 931. In this case, the nodes are maintained at H level and the input voltages to the subsequent circuits are determined. This timing control can be performed by changing the switch 944 when the output from the buffer circuit 937 becomes H level.

When the pulse generating circuit is started by the starting signal produced from the circuit structure described above, the starting signal inputted to the starting circuit becomes a cyclic signal having the cycle equivalent to the delay of the delay circuit constituting the pulse wave generating sub circuits multiplied by an even number. Thus, the pulse generating circuit can successively generate extremely high-speed pulse waves. According to the fourth embodiment, successive pulses and intermittent pulses can be switched according to the situation. Thus, advantages such as high-speed capturing operation can be offered when successive pulses are used in the UWB transmitting and receiving devices for synchronous capturing or for other purposes.

Fifth Embodiment

A pulse generating circuit according to a fifth embodiment is now described. Assuming that i is an even number in the pulse wave generating sub circuits in the first embodiment shown in FIG. 3, the N channel MOS transistor connected in series is turned on and connected to the voltage V1 when (1) the logical product of $XD_{i-1}$ and $D_i$ is true. Also, the P channel MOS transistor connected in series is turned on and connected to the voltage V2 (2) when the logical product of $XD_i$ and $D_{i+1}$ is true. By this method, a series of pulse waves are generated in response to falling of the starting signal $D_0$.

The following method is also possible by slightly altering the logic of switch changeover. The P channel MOS transistor connected in series is turned on and connected to the voltage V2 when (3) the logical product of $D_{i-1}$ and $XD_i$ is true. Also, the N channel MOS transistor connected in series is turned on and connected to the voltage V1 (4) when the logical product of $D_i$ and $XD_{i+1}$ is true. By this method, a series of pulse waves are generated in response to rising of the starting signal $D_0$. (see PulseOut 2 in FIG. 4).

In this case, the noise 2001 generated at the undesirable position shown in FIG. 19C can be reduced. Moreover, pulses are produced at both poles of the variable point where current is consumed in the inverter delay circuit. As a result, power consumption can be reduced. More specifically, in the pulse wave generating sub circuit according to the first embodiment shown in FIG. 4, pulses are generated only during the period from t1 to t9 in the periods from t'1 to t'9 and from t1 to t9 during which the inverter delay circuit line consumes power. According to the method shown discussed above, pulses are generated in both the periods from t'1 to t'9 and from t1 to t9. Thus, power consumption for each pulse can be decreased.

Figure 10:
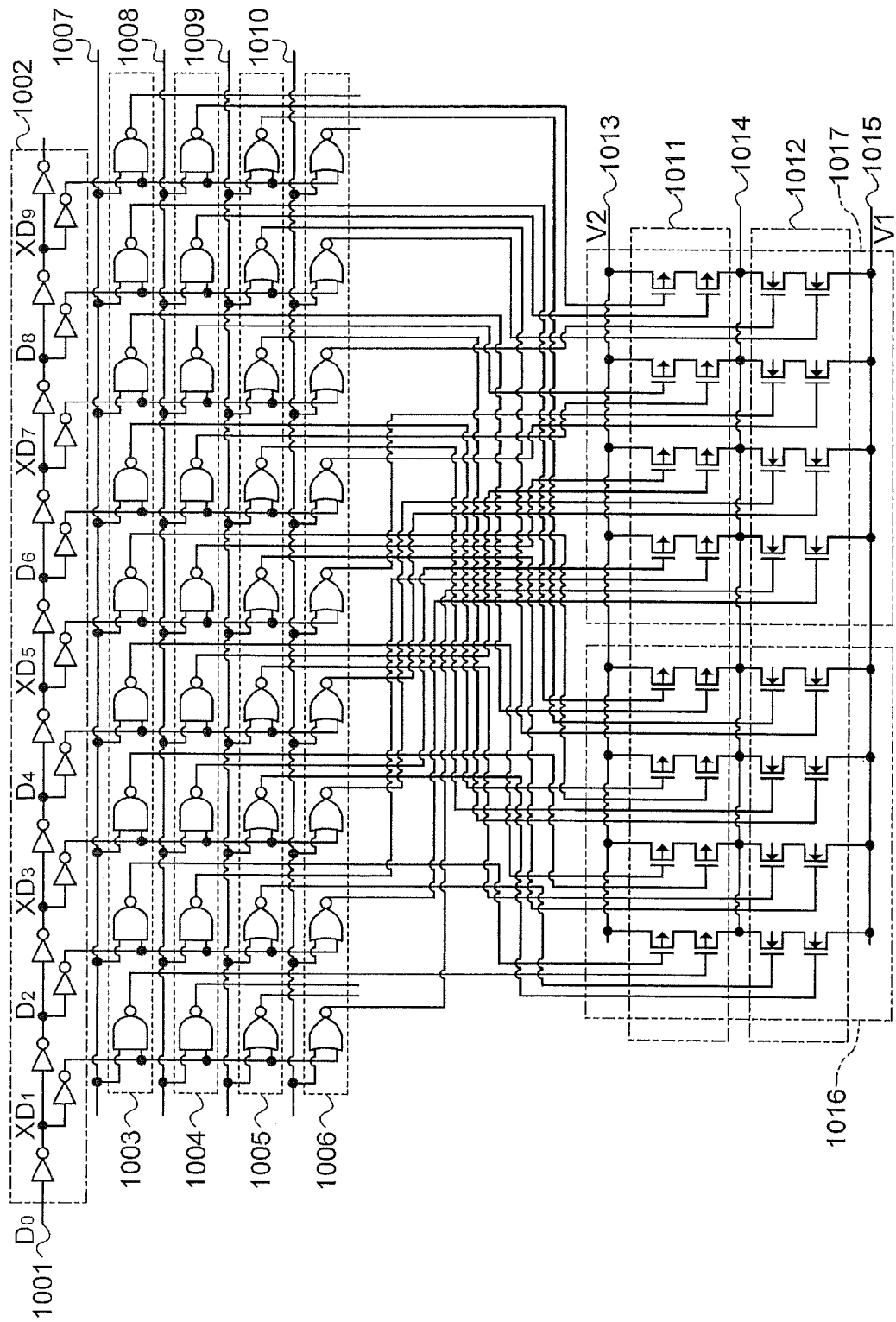
FIG. 10 is a circuit diagram showing a pulse wave generating sub circuit of a pulse generating circuit according to a fifth embodiment.

The structure of the pulse generating circuit according to the fifth embodiment is now described with reference to FIG. 10. FIG. 10 is a circuit diagram showing a pulse wave generating sub circuit of the pulse generating circuit in the fifth embodiment.

A pin 1001 is an input pin to which the starting signal $D_0$ is inputted. An inverter delay circuit line 1002 generates outputs $XD_{i-1}$ and $D_i$ (i: even number in the range of $2 \leq i \leq 10$) produced by delaying $D_0$ by td for each inverter delay circuit and reversing the logic. These signals are outputted via buffer.

Transistors within a section indicated by an alternate long and short dash line 1011 are a switching array containing pairs of P channel MOS transistors connected in series. When the gate voltages of a pair of the P channel MOS transistors become simultaneously L level (in case of (2) or (3) discussed above), the switching array is turned on and connects a pulse output pin 1014 to the voltage V2 connected with a pin 1013.

Transistors within a section indicated by an alternate long and short dash line 1012 are a switching array containing pairs of N channel MOS transistors connected in series. When the gate voltages of a pair of the N channel MOS transistors become simultaneously H level (in case of (1) or (4) discussed above), this switching array is turned on and connects the pulse output pin 1014 to the voltage V2 connected with a pin 1015.

A switching array within a section indicated by an alternate long and two short dashes line 1016 generates pulses in response to falling of the starting signal $D_0$. A switching array within a section indicated by an alternate long and two short dashes line 1017 generates pulses in response to rising of the starting signal $D_0$.

A NAND gate bank is provided within a section indicated by a dotted line 1003 or a section indicated by a dotted line 1004. The output and one of the input pins of each circuit contained in the inverter delay circuit line 1002 are connected to the NAND gate bank, and the output pins of the NAND gate are connected to the gates of the respective transistors of the switching arrays 1011 and 1012. Similarly, a NOR gate bank is provided within a section indicated by a dotted line 1005 or a section indicated by a dotted line 1006. The output and one of the input pins of each circuit contained in the inverter delay circuit line 1002 are connected to the NOR gate bank, and the output pins of the NOR gate are connected to the gates of the respective transistors of the switching arrays 1011 and 1012. Transmission from the respective outputs of the inverter delay circuit line 1002 to the switching arrays 1016 and 1017 is controlled by applying predetermined voltage to control pins 1007, 1008, 1009, and 1010 of these gates. More specifically, under the condition where the control pins 1007 and 1010 are at H level and where the control pins 1008 and 1009 are at L level, signals are transmitted from the inverter delay circuit line 1002 only to the switching array 1016. In this case, the switching array 1017 is all turned off, and pulse waves are generated at falling of the signal $D_0$. On the contrary, under the condition where the control pins 1007 and 1010 are at L level and where the control pins 1008 and 1009 are at H level, signals are transmitted from the inverter delay circuit line 1002 only to the switching array 1017. In this case, the switching array 1016 is all turned off, and pulse waves are generated at rising of the signal $D_0$. Under the condition where the control pins 1007 and 1008 are at H level and where the control pins 1009 and 1010 are at L level, signals are transmitted from the inverter delay circuit line 1002 to the switching arrays 1016 and 1017. In this case, pulse waves are generated at both edges of rising and falling of the signal $D_0$.

The method of switching between one edge starting and both edge starting of the signal $D_0$ by using the gate bank as described above offers the following advantages. The inverter delay circuit in a certain case has a slight difference between the delay time from rising of an input signal to falling of an output signal and the delay time from falling of the input signal to rising of the output signal. When this difference is produced, unbalanced conditions such as different amplitudes between pulses generated at rising of $D_0$ and falling of $D_0$ are caused. This effect becomes more remarkable as pulses to be generated are narrowed. It is possible, however, to select both edge starting when power consumption reduction is desired and select one edge starting when accurate pulse generation is desired by switching between one edge starting and both edge starting using the gate bank.

As can be seen through careful look at FIG. 4 again, pulse outputs are generated from rising edge of $D_0$ with delay td when pulse generation is started at rising of $D_0$, but pulse outputs are generated from falling edge of $D_0$ with delay 2 td when pulse generation is started at falling of $D_0$. When a problem is caused by the time difference between the starting edge and pulse generation, adjustment may be made for eliminating this time difference. For achieving this adjustment, rising of $D_0$ is delayed by td, for which the circuit shown in FIG. 8A is appropriately used. However, two circuits are provided as the delay circuit 801, and each delay time of the two circuits is set at td/2 such that the total delay time of the two circuits becomes td. The manufacturing method of the delay circuit accurately producing delay time of td/2 will be described later.

FIG. 10 shows two NAND gates or two NOR gates connected with $XD_1$ and $XD_9$ and producing open (not connected) output signals. These gates are connected as dummy loads to equalize loads of buffers for the outputs $XD_1$ and $XD_9$ from the inverter delay circuit line 1002 with those of other output signals. By this method, pulse waveform errors before and behind pulse waves to be generated can be reduced. Thus, pulse waves having longer cycle are generated at the front edge of each pulse, and pulse waves having shorter cycle are generated at the rear edge of each pulse. The pulse output pin 1014 is not connected during the periods from t'9 to t1 and from t9 to t'1 during which no pulse wave is generated in the timing chart of FIG. 4 in FIG. 10. For solving this problem, it is possible to provide a certain fixed voltage (such as V1) during this period by adding switch circuit and simple logic circuit like the first embodiment shown in FIG. 3. In this case, the output signals of gates not used as discussed above can be utilized. This method is easily practiced, and therefore is not particularly described herein.

The structure according to the fifth embodiment reduces power consumption per pulse at the time of pulse generation.

Sixth Embodiment

A pulse generating circuit according to a sixth embodiment is now described. In the fifth embodiment, the predetermined amount of the starting time difference between the two pulse wave generating sub circuits is Pw (=td). In the sixth embodiment, this amount is set at Pw/2 (=td/2).

Figure 11A:
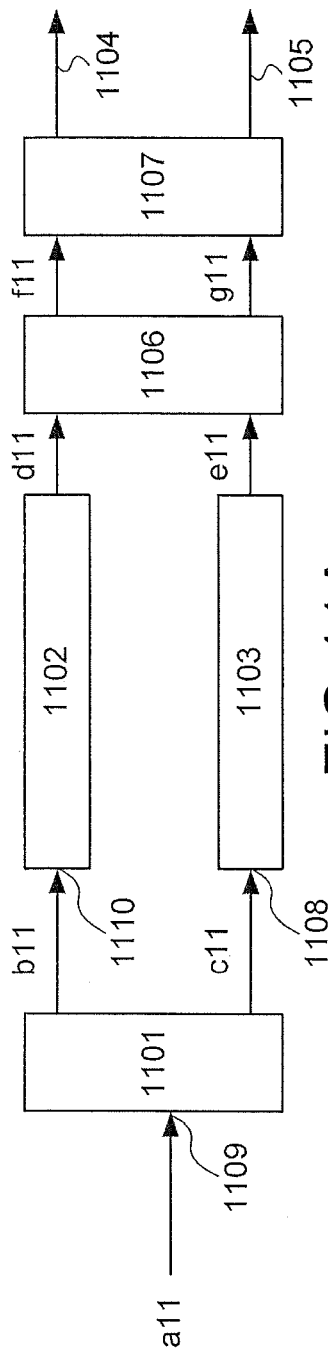
FIGS. 11A and 11B are circuit diagrams showing a pulse generating circuit according to a sixth embodiment.
Figure 11B:
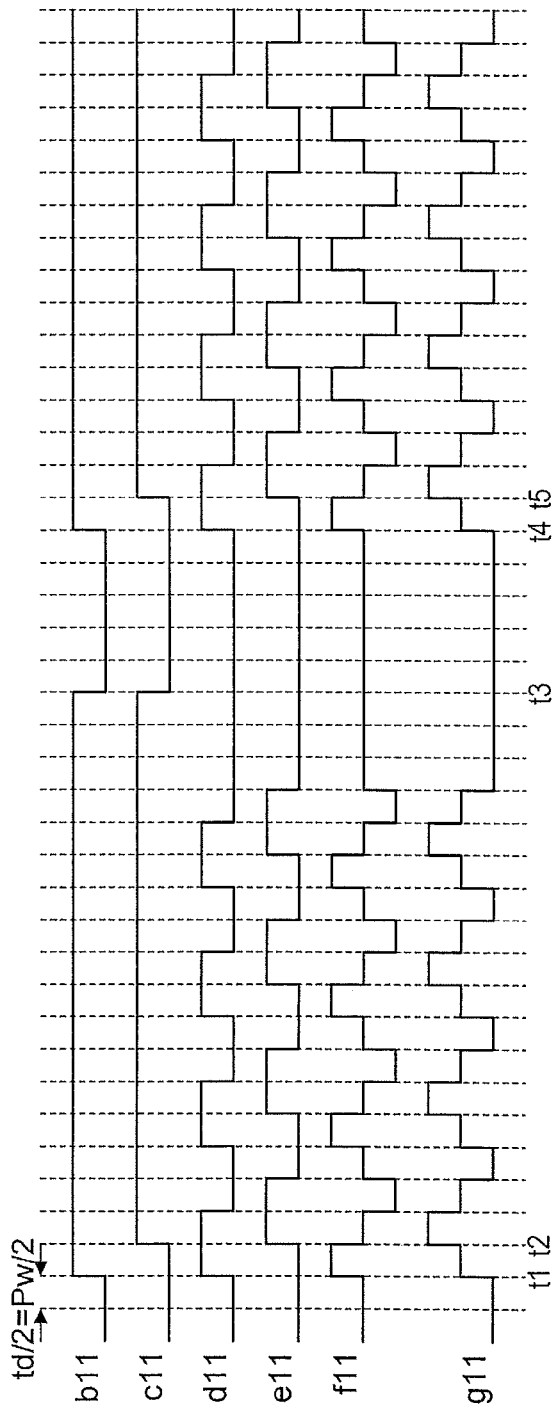

The structure of the pulse generating circuit in the sixth embodiment is described with reference to FIGS. 11A and 11B. FIGS. 11A and 11B are circuit diagrams showing the pulse generating circuit in the sixth embodiment.

FIG. 11A is a block diagram of the pulse generating circuit which generates a pair of pulse signals having different phases by 90 degrees, and FIG. 11B is a timing chart showing operation of the pulse generating circuit.

A starting circuit 1101 receives a generation starting signal all inputted to a pin 1109, and generates two starting signals b11 and c11 having time difference Pw/2 (Pw: half of pulse carrier wave frequency) to output the starting signals b11 and c11 to pins 1110 and 1108.

Pulse wave generating sub circuits 1102 and 1103 contain the pulse wave generating sub circuits 102 and 103 shown in FIG. 3 as an example. The delay td per one circuit of the inverter delay circuit in the pulse wave generating sub circuits 1102 and 1103 is adjusted to a period equivalent to Pw. The pulse wave generating sub circuits 1102 and 1103 generate pulse waves d11 and e11 having dime difference td/2=Pw/2, that is, ¼ of the pulse carrier cycle (see FIG. 11B). The time difference of Pw/2 corresponds to phase difference of 90 degrees. By this method, a pair of pulses (a pair of I and Q signals) having phase difference of 90 degrees required for synchronism detection waves of the receiving device or for other purpose can be generated.

The pulse waves d11 and e11 of he pulse wave generating sub circuits 1102 and 1103 are inputted to an orthogonalizing circuit 1106 as an adding and subtracting circuit to correct slight errors of the starting signals b11 and c11 generated from the starting circuit 1101. It is required that the time difference between the pair of the starting signals accurately becomes td/2, but the inverter delay circuits producing delay of td contained in the pulse wave generating sub circuits cannot be used for generating the accurate starting signals. In the sixth embodiment, it is assumed that error exists in the time difference td/2 between the pair of the staring signals, and a method for correcting this time difference is shown.

The orthogonalizing circuit 1106 is a matrix circuit which outputs difference and sum of vectors. When outputs from the orthogonalizing circuit 1106 are f11 and g11, equations f11=d11−e11 and g11=d11+e11 hold.

The fact that the signal f11=d11−e11 is orthogonal to the signal g11=d11+e11 is clarified by the following reason. The inner product of the sum and difference of the vector d11 and e11 is represented by <d11+e11, d11−e11>=<d11, d11>+<e11, d11>−<d11, e11>−<e11, e11>=<d11, d11>−<e11, e11>. When the absolute values (wave heights in case of signal) of the d11 and e11 are equal, <d11, d11>and <e11, e11>are equal. In this case, the inner product of <d11+e11, d11−e11>becomes zero. That is, the signal f11=d11−e11 is orthogonal to the signal g11=d11+e11. The sum and difference are calculated by using an analog addition/subtraction amplifying circuit. The expression <a, b> represents the inner product of vectors a and b.

The pulse waves d11 and e11 are generated from the pulse wave generating sub circuits 1102 and 1103 having the same characteristics, and thus have the same wave height. Thus, when the sum and difference of the pulse waves d11 and e11 are produced by using the orthogonalizing circuit 1106, the output signals become orthogonal to each other. FIG. 11B shows digital and angular signal waveforms for simplifying the explanation. Actually, the signal waveforms are round and analog-shaped due to high speed operation, but the same explanation is applicable to this case. While the wave heights (amplitudes) of the signals d11 and e11 are equal, the signal f11 and g11 as the sum and difference of the signals d11 and e11 are not necessarily the same. The difference between the wave heights of the signals f11 and g11 increases as the shift of the pulse waves d11 and e11 from orthogonality increases. An amplitude limiting circuit 1107 equalizes the amplitudes of the signals f11 and g11 and outputs the resultant signals f11 and g11 from the output pins 1104 and 1105.

The starting circuit 1101 in the sixth embodiment generates the starting signals b11 and c11 having the time difference corresponding to half of the pulse width Pw of the generated pulses. Also, the pulse wave generating sub circuits 1102 and 1103 contains two circuits having the same characteristics and outputting predetermined pulse waves in response to the starting signals b11 and c11. Thus, it is possible to generate the two pulse waves d11 and e11 having different phases by 90 degrees. Since the pulses are generated from the pulse wave generating sub circuits 1102 and 1103 having the same characteristics, the generated pulse waves (I and Q signals) have stabilized DC level and preferable symmetry due to phase difference by 90 degrees. The circuit according to the sixth embodiment generates single-end I and Q signals as an example.

Moreover, the orthogonalizing circuit 1106 for calculating the sum and difference of the pulse waves d11 and e11 from the pulse wave generating sub circuits 1102 and 1103 is further provided. Thus, the degree of orthogonality of the I and Q signals generated from the pulse wave generating sub circuits 1102 and 1103 can be further increased.

Seventh Embodiment

A pulse generating circuit according to a seventh embodiment is now described. In the seventh embodiment, the structure of the starting circuit 1101 shown in FIG. 11A is employed as an example. Since the pulse wave generating sub circuits particularly generate pulse waves at high speed close to the performance limitation of the elements, the delay of the inverter delay circuits constituting the pulse wave generating sub circuits is extremely short in many cases. Thus, there is a possibility that delay circuits can produce delay of td but cannot produce delay of td/2. In the seventh embodiment, a method for accurately producing time difference of td/2 is shown even when the delay td is an extremely short period.

Figure 12:
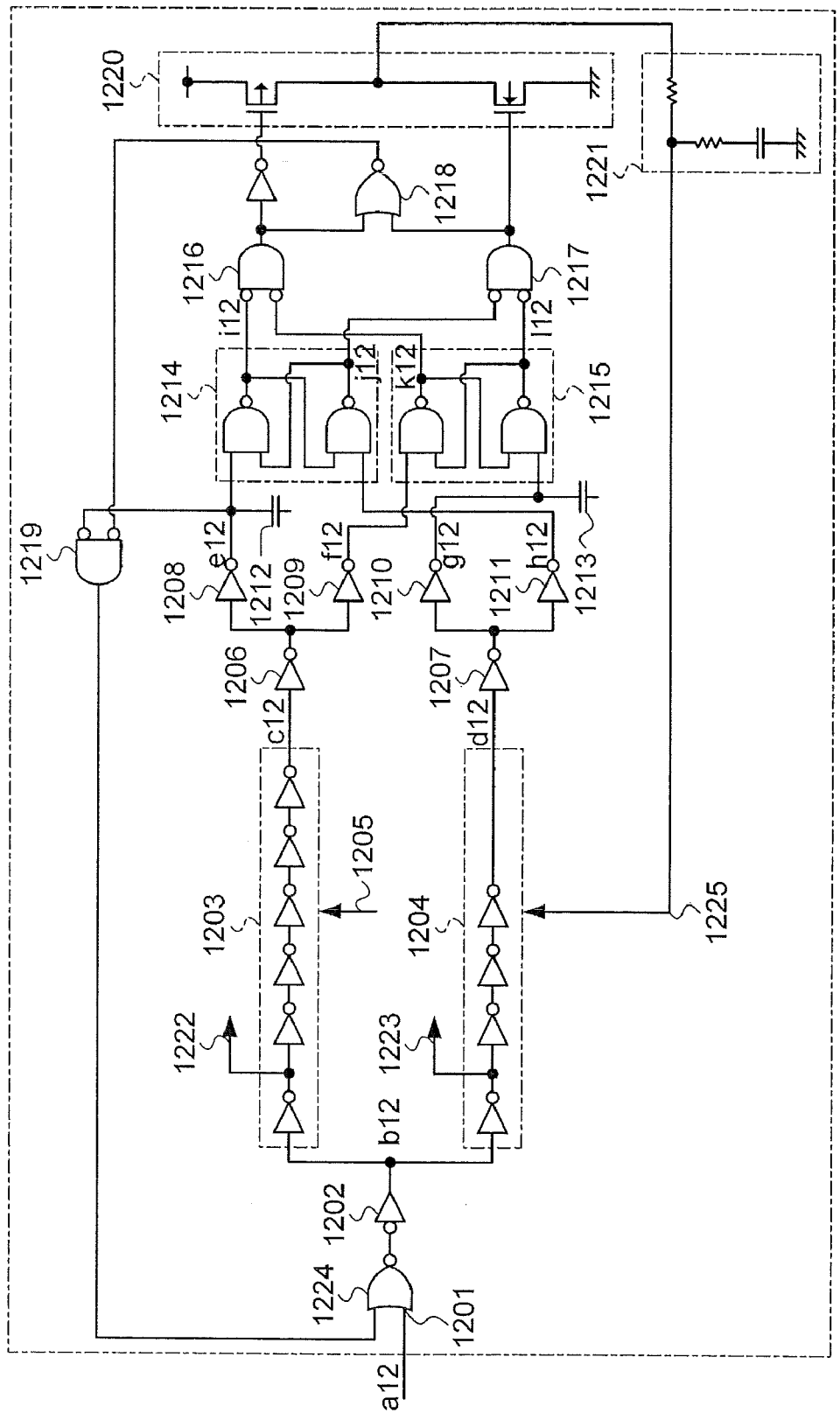
FIG. 12 is a block diagram showing a starting circuit according to a seventh embodiment.
Figure 13:
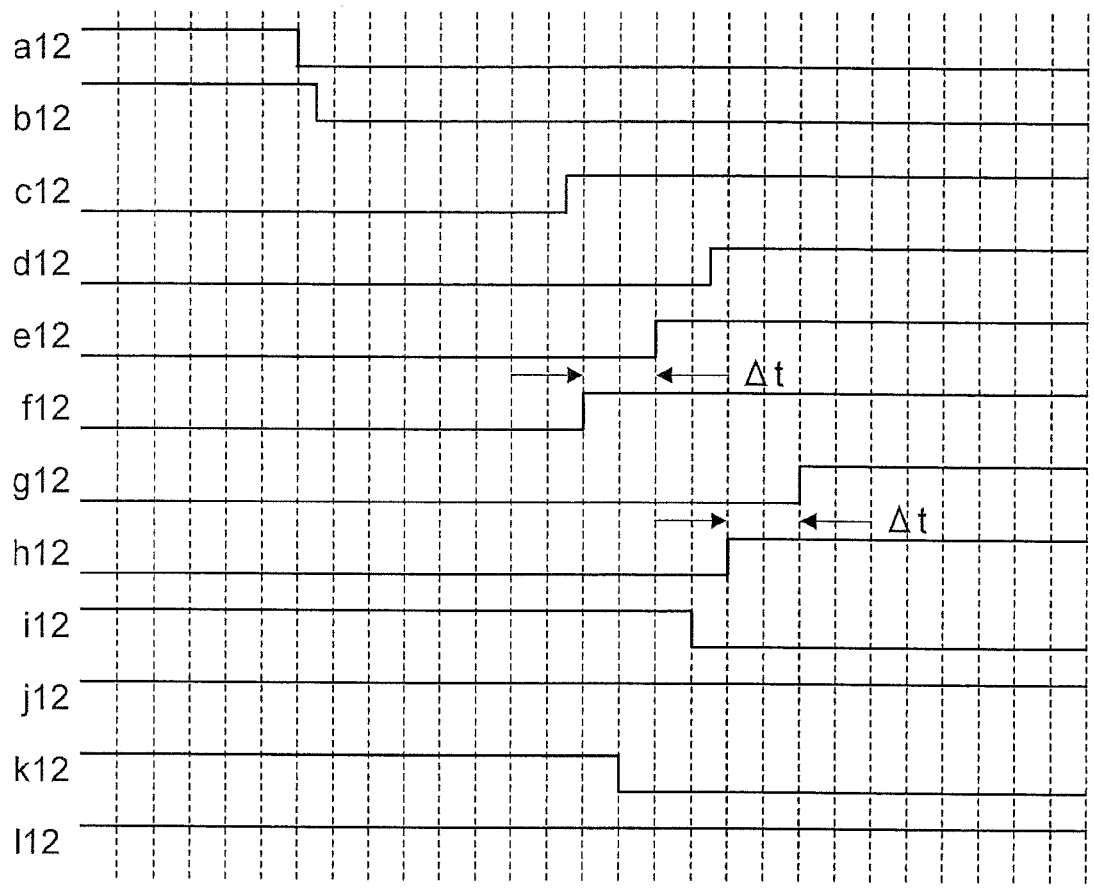
FIG. 13 is a timing chart showing operation of the starting circuit according to the seventh embodiment.

FIG. 12 is a block diagram showing the starting circuit in the seventh embodiment. FIG. 13 is a timing chart showing the operation of the starting circuit.

As illustrated in FIG. 12, a pin 1201 is an input pin to which a generation starting signal a12 is inputted. The generation start signal a12 inputted thereto is further inputted to an inverter delay circuit line 1204 having four circuits and an inverter delay circuit line 1203 having six circuits via an NOR gate 1224 and a buffer circuit 1202. When delay is controlled such that the timing of a signal c12 generated from the inverter delay circuit line 1203 coincides with the timing of a signal d12 generated from the inverter delay circuit line 1204 started simultaneously with the inverter delay circuit line 1203 in response to the generation starting signal a12, ratio of the delay per one circuit of the inverter delay circuit line 1203 to that of the inverter delay circuit line 1204 becomes 1:1.5. When output signals extracted from the initial circuits of the inverter delay circuit lines 1204 and 1203 are given to the pulse wave generating sub circuits 1102 and 1103 as starting signals 1222 and 1223, the starting time difference becomes Pw/2(=td/2). By this method, the pair of starting signals having shorter time difference than td can be obtained without using inverter delay circuits producing shorter delay than td.

A method for producing delay of the inverter delay circuit line 1203 having six circuits equivalent to delay of the inverter circuit line 1204 having four circuits is now described with reference to FIGS. 12 and 13.

When the generation starting signal a12 is inputted to the pin 1201, a signal b12 is inputted to the two inverter delay circuit lines 1203 and 1204 with delay produced by the NOR gate 1224 and the buffer circuit 1202. The buffer circuit 1202 and buffer circuits 1206 and 1207 disposed on the output sides of the inverter delay circuit lines 1203 and 1204 are provided to equalize the input and output conditions of the two inverter delay circuits 1203 and 1204. The delay time per one inverter delay circuit constituting the inverter delay circuit line 1203 is controlled to be equivalent to td by controlling voltage applied to a delay control pin 1205.

The inverter delay circuit line 1203 produces the signal c12 having delay of 6 td from the signal b12 and outputs the signal c12. The output signal d12 is outputted from the inverter delay circuit line 1204 having four circuits. The two buffer circuits 1208 and 1209 input the signal c12 via the buffer circuit 1206, and outputs signals e12 and f12. A load capacity 1212 is connected to the output of the buffer circuit 1208 such that the signal e12 is outputted with delay of Δt from the signal f12. Similarly, two buffer circuits 1210 and 1211 input the signal d12 via the buffer circuit 1207 and output signals g12 and h12. A load capacity 1213 is connected to the output of the buffer circuit 1210 such that the signal g12 is outputted with delay of Δt from the signal h12. When the characteristics of the buffer circuit 1206 identical to those of the buffer circuit 1207, the characteristics of the buffer circuit 1208 identical to those of the buffer circuit 1210, the characteristics of the buffer circuit 1209 identical to those of the buffer circuit 1211, and the characteristics of the load capacity 1212 identical to those of the load capacity 1213, the delay time from the signal c12 to the signal e12 becomes equivalent to the delay time from the signal d12 to the signal g12. Also, the delay time from the signal c12 to the signal f12 becomes equivalent to the delay time from the signal d12 to the signal h12.

When two input pins of each of RS flip-flop circuits 1214 and 1215 having two NAND gates change from L, L to H, H with different delay time, the output pin having changed with delay outputs H level and retains the level. According to the seventh embodiment, which of e12 or h12 and which of f12 or g12 have changed with delay are detected by using the RS flip-flop circuits 1214 and 1215. FIG. 13 shows an example in which the signal d12 is delayed from the signal c12 by Δt or longer.

Two output signals i12 and j12 of the RS flip-flop circuit 1214 detect which of the input signals e12 and h12 rises later. Since the signal h12 rises later, the corresponding output signal j12 keeps H level and the signal i12 becomes L level.

Similarly, two signals k12 and l12 of the RS flip-flop circuit 1215 detect which of the input signals f12 and g12 rises later. Since the signal g12 rises later, the corresponding output signal l12 keeps H level and the signal k12 becomes L level.

When both the signals i12 and k12 are at L level, the signal c12 rises earlier than the signal d12 by Δt or longer. When both the signals j12 and l12 are at L level, the signal d12 rises earlier than the signal c12 by Δt or longer. In other cases, the rising time difference between the signals c12 and d12 is within Δt.

An NOR gate 1216 outputs H level when both the signals i12 and k12 are at L level, and controls a charge pump 1220 to inject charge to a low-pass filter 1221. An NOR gate 1217 outputs H level when both the signals j12 and l12 are at L level, and controls the charge pump 1220 to withdraw charge from the low-pass filter 1221. By this method, voltage applied to a delay control pin 1225 of the inverter delay circuit line 1204 is increased such that the signal d12 rises early when both the signals i12 and k12 are at L level, that is, the signal c12 rises early than the signal d12 by Δt or longer. On the contrary, voltage applied to the delay control pin 1225 of the inverter delay circuit line 1204 is decreased such that the signal d12 rises late when both the signals j12 and l12 are at L level, that is, the signal c12 rises later than the signal d12 by Δt or longer. In other conditions, the charge pump 1220 is deactivated, and the low-pass filter 1221 retains the voltage applied to the delay control pin 1225 of the inverter delay circuit line 1204.

When Δt is set at a value within four times longer than the allowable error of 1.5×td, the control voltage is corrected such that the delay for each circuit of the inverter delay circuit line 1204 is kept within the positive and negative allowable error range of 1.5×td.

An NOR gate 1218 detects the case when the control voltage applied to the inverter delay circuit line 1204 needs to be corrected. In this case, an NOR gate 1219 returns the output from the inverter delay circuit line 1203 to the inverter delay circuit line 1203 via an NOR gate 1224 to form a ring generating circuit. The ring generating circuit thus produced continues generation until the voltage applied to the delay control pin 1225 of the inverter delay circuit line 1204 is corrected such that the delay difference lies within Δt. Then, the ring generating circuit operates the charge pump 1220 to continue charge and discharge to and from the low-pass filter 1221.

The starting circuit 1101 in the seventh embodiment is characterized by including the inverter delay circuits having the same delay as that of the inverter delay circuits constituting the pulse wave generating sub circuits, and the inverter delay circuits having 1.5 times longer delay.

According to the pulse generating circuit in the seventh embodiment, starting signals having shorter time difference than td, i.e., having delay of td/2 can be produced without requiring inverter delay circuits producing shorter delay than td. This pulse generating circuit is particularly appropriate when high-speed operation of the circuit close to the limit of the elements is required.

Eighth Embodiment

Figure 14A:
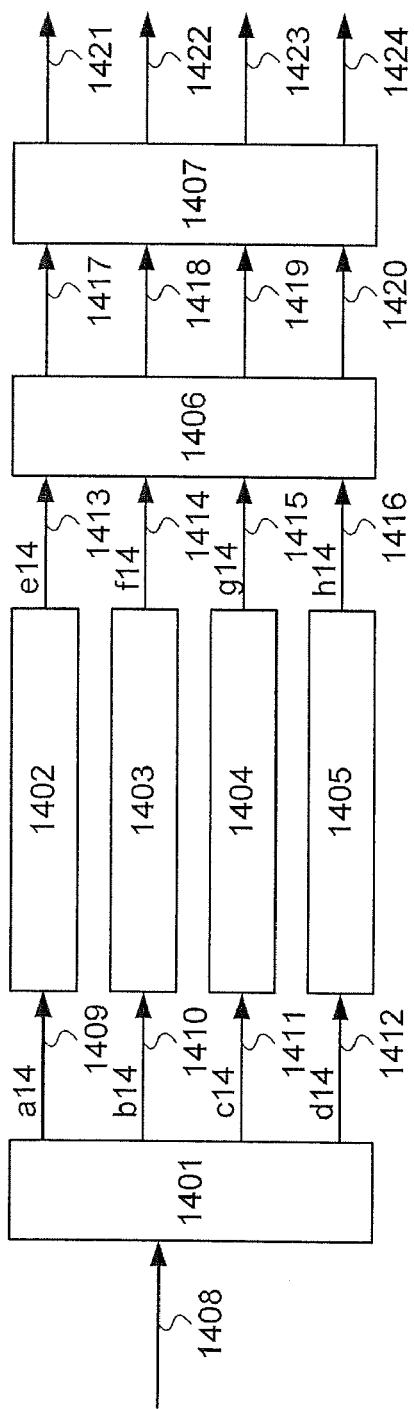
FIGS. 14A through 14C are block diagrams showing a pulse generating circuit according to an eighth embodiment.
Figure 14C:
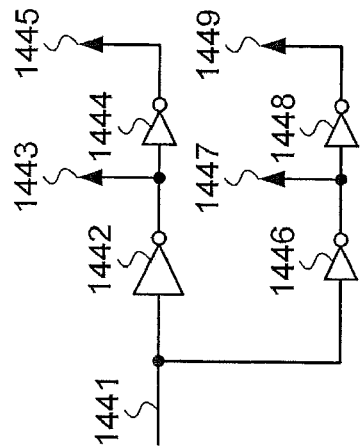
Figure 14B:
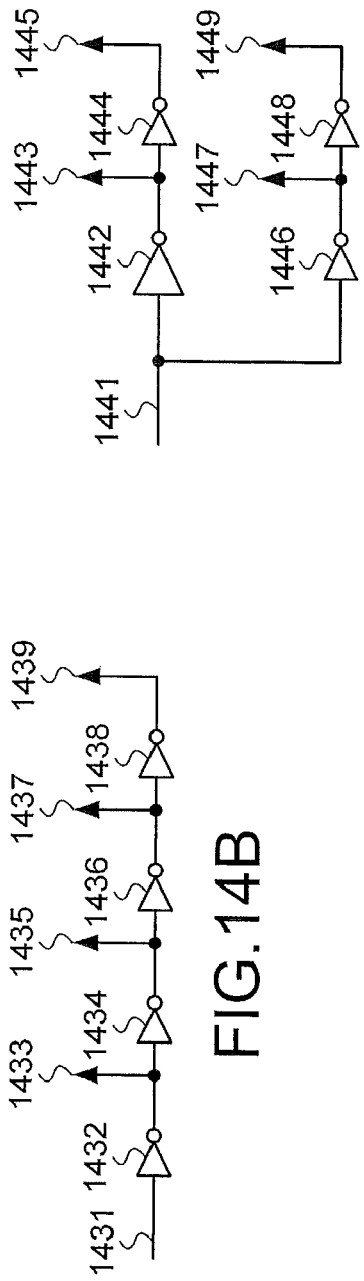

A pulse generating circuit according to an eighth embodiment is now described. FIGS. 14A through 14C are block diagrams showing the pulse generating circuit in the eighth embodiment.

The pulse generating circuit shown in FIGS. 14A through 14C uses four pulse wave generating sub circuits. A starting circuit 1401 generates four starting signals a14, b14, c14, and d14 having time difference of Pw/2 in response to a generation staring signal inputted to a pin 1408, and outputs these signals from corresponding pins 1409, 1410, 1411, and 1412. Four pulse wave generating sub circuits 1402, 1403, 1404, and 1405 having the same characteristics receive the starting signals a14, b14, c14, and d14, and generate pulse waves e14, f14, g14, and h14 having the pulse width Pw to output those pulse waves from pins 1413, 1414, 1415, and 1416. Each specific structure of the pulse wave generating sub circuits 1402, 1403, 1404, and 1405 is the same as that shown in FIG. 3 or FIG. 10, and the delay per one inverter delay circuit constituting these pulse wave generating sub circuits is td. When td=Pw, each phase of the pulse waves e14, f14, g14, and h14 can be shifted from one another by 90 degrees. When the pulse waves e14, g14, f14, and h14 are a set of pulse waves, these pulse waves can be considered as differential signals having phase difference of 90 degrees, i.e., the I and Q signals.

These pulse waves e14, g14, f14, and h14 are inputted to an orthogonalizing circuit 1406, where phase error produced by slight error of td is corrected. Then, the amplitudes are equalized by an amplitude limiting circuit 1407 via pins 1417 through 1420, and the resultant pulse waves are outputted from pins 1421 through 1424. The structure of the orhogonalizing circuit 1406 is the same as that in the sixth embodiment described above. The sum and difference can be calculated more easily than in case of the sixth embodiment since the differential signal pairs can be obtained. More specifically, when the pairs of pulse waves e14 and h14, g14 and f14, e14 and g14, and f14 and h14 are inputted to the corresponding four differential amplifying circuits having the same characteristics, the outputs from the differential amplifying circuits are amplified signals e14−h14, g14−f14, e14−g14, and f14−h14. These signals are differential signals indicating the sum and difference of the vectors described in the sixth embodiment.

FIG. 14B illustrates a specific structure example of the starting circuit 1401. The four inverter delay circuits 1432, 1434, 1436, and 1438 produce delay of td/2. Since the delay of the inverter delay circuits 1432, 1434, 1436, and 1438 is half of the delay td of the inverter delay circuits constituting the pulse wave generating sub circuits 1402 through 1405, the same circuits cannot be used. However, errors are corrected by the orthogonalizing circuit 1406 and thus high accuracy is not required.

The inverter delay circuit having delay of td/2 as delay ratio of 1:2 can be produced by controlling the size of the buffer circuit 1905 such that the ratio of the drain capacity of the MOS transistors 1902 and 1903 shown in FIG. 18 to the sum of the input capacity of the buffer circuit 1905 and parasitic capacity parasitic on the wires and the like becomes 1:2. In this method, the error factor is determined only by mask accuracy in the manufacture process of the semiconductor integrated circuits. Thus, the ratio of delay is less variable and stabilized in case of fluctuations in temperature and source voltage.

The staring circuit 1401 cannot be used when high-speed operation close to the limit of the element performance is required. An example of the starting circuit 1401 appropriately used when the high-speed operation is necessary is shown in FIG. 14C. Delay circuits 1444, 1446, and 1448 having delay of td are connected with a delay circuit 1442 having delay of 1.5 td in the manner shown in FIG. 14C, and the starting signals a14, b14, c14, and d14 of the pulse wave generating sub circuits are extracted via pins 1447, 1443, 1449, and 1445. In this case, each of the starting signals a14, b14, c14, and d14 obtains time difference of td/2.

The starting circuit 1401 according to the eighth embodiment is characterized by including the four pulse wave generating sub circuits 1402, 1403, 1404, and 1405 having the same characteristics. These pulse wave generating sub circuits 1402, 1403, 1404, and 1405 generate the four signals a14, b14, c14, and d14 having time difference corresponding to half of the pulse width Pw of generated pulses, and produce predetermined pulse waves in response to the starting signals a14, b14, c14, and d14.

The pulse generating circuit having this structure can generate four signals having phase difference by 90 degrees, i.e., two sets of differential signals (I and Q differential signals) having phase difference by 90 degrees.

Ninth Embodiment

A pulse generating circuit according to a ninth embodiment is now described.

Figure 15:
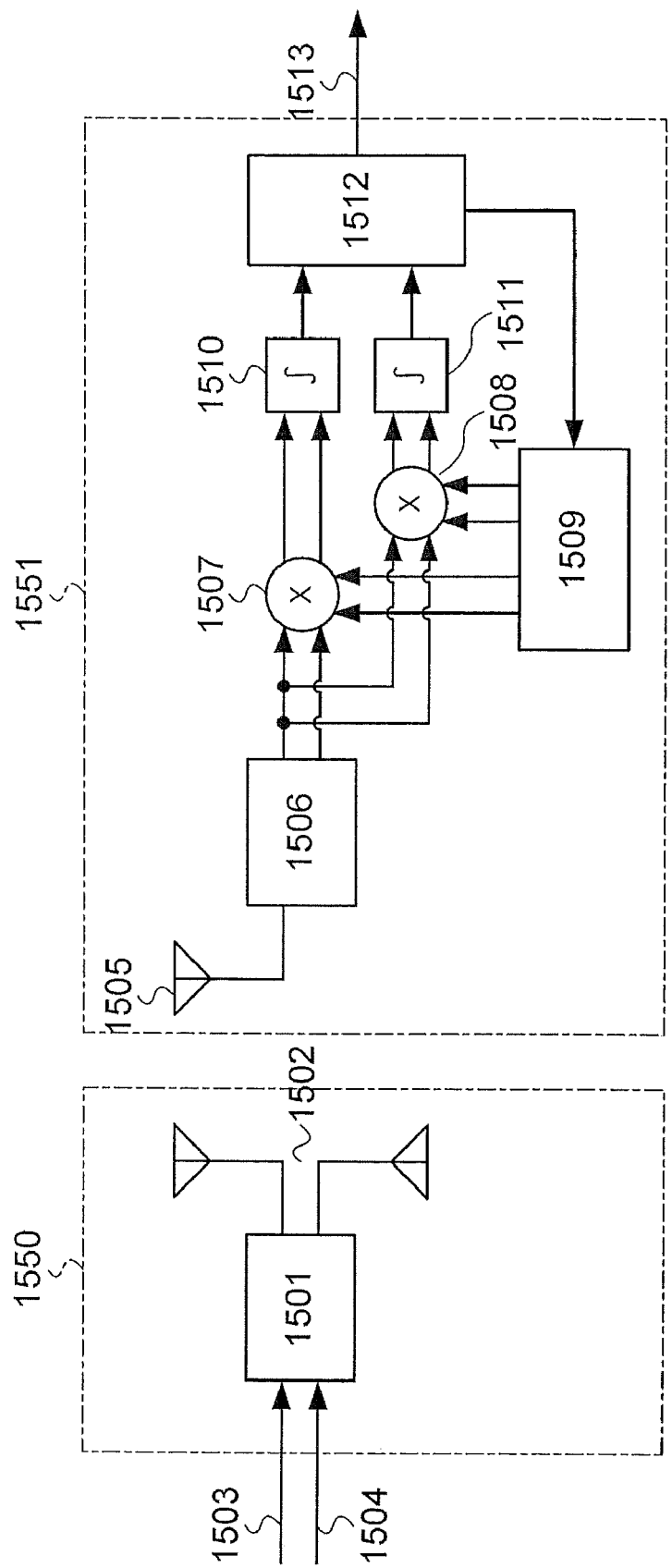
FIG. 15 illustrates a UWB communication system electronic device using the pulse generating circuit according to one of the first through eighth embodiments.
Figure 17A:
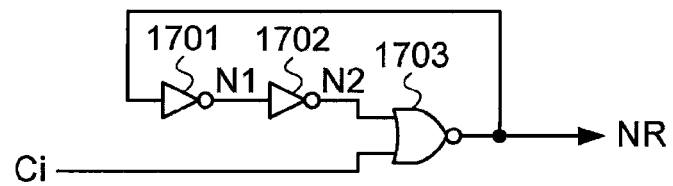
FIGS. 17A and 17B are circuit diagram and timing chart of a pulse generating circuit in related art.
Figure 17B:
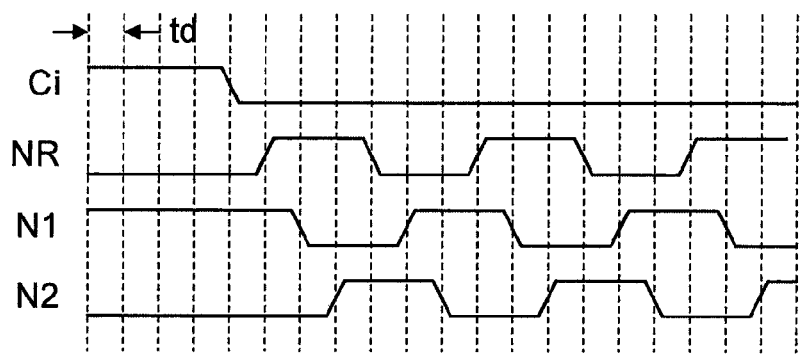

FIG. 15 illustrates a UWB communication system including the pulse generating circuit according to one of the first through eighth embodiments applied to a UWB transmitting and receiving device.

A pulse generating circuit 1501 includes the starting circuit 101 shown in FIG. 5A and the switch circuit 529 shown in FIG. 5C and constitutes a UWB transmitting device 1550. More specifically, a pin 1503 is a pin to which a generation starting signal is inputted and corresponds to the pin 519 shown in FIG. 5A. A pin 1504 is an input pin to which data to be transmitted is inputted, and corresponds to the pin 510 shown in FIG. 5A and the pin 530 shown in FIG. 5C. When a generation starting signal is inputted to the pin 1503, the pulse generating circuit 1501 generates one pulse. In this case, the polarity of the outputted pulse is switched according to the transmission data inputted to the pin 1504. This modulation system is considered as pulse bi-phase modulation (BPM). As illustrated in FIG. 15, two balanced-type antennas 1502 are provided in the pulse generating circuit 1501 to generate differential pulse signals. Thus, the transmitting device using the pulse generating circuit 1501 can operate the balanced-type antennas 1502, and obtain large output by low voltage.

The transmitting device may connect a delay circuit to the starting signal to perform pulse position modulation for changing the delay time according to the transmission data. The methods described herein can be employed for pulse position modulation (PPM).

When the quadrature-phase pulse generating circuit shown in FIG. 14A is used, IQ orthogonal pulse modulation can be performed. More specifically, for the pair of the starting signals a14 and c14 generated from the pulse wave generating sub circuits 1402 and 1404 and the pair of the starting signals b14 and d14 generated from the pulse wave generating sub circuits 1403 and 1405, two starting circuits equivalent to that shown in FIG. 5A are used as the starting circuit 1401 shown in FIG. 14A to apply quadrature-phase modulation (QPM) to each of the I and Q signals. Then, the signals of pins 1421 and 1422 are added, and the signals of pins 1423 and 1424 are added to feed power to the balanced-type antenna 1502 as two signals. For modulation, the switch circuit shown in FIG. 5C may be inserted to the pin on the output side.

A circuit including a receiving antenna 1505 shows the structure of a receiving circuit 1551. The UWB pulse signal received by the receiving antenna 1505 is amplified by a low-noise amplifying circuit 1506, and inputted to mixer circuits 1507 and 1508 for I and Q signals. The mixer circuits 1507 and 1508 multiply the inputted signals by template pulse generated by a template pulse generating circuit 1509 and transmits the results to integrating circuits 1510 and 1511. The integrating circuits 1510 and 1511 remove high-frequency components from the signals mixed (multiplied) by the mixer circuits 1507 and 1508 to demodulate the signals. A circuit 1512 judges transmitted bits based on the intensities of the respective signals to return the signals to the original transmission data.

The template pulse generating circuit 1509 may be constituted by the pulse generating circuit shown in FIG. 14A. The pulse generating circuit shown in FIG. 14A can generate bi-phase differential signals I and Q, and can use differential type circuits such as low-noise amplifying circuit 1506 and the mixer circuits 1507 and 1508. The differential type circuits are appropriate for canceling of the same phase noise and low voltage operations, and therefore preferable for constituting a low-power and low-noise device. When the IQ template pulse generating circuit 1509 constituted by the pulse generating circuit shown in FIG. 14A is used, efficient reception can be achieved at the time of BPM and PPM as well as QPM. That is, methods such as using the I channel for data demodulation and Q channel for tracking can be used at the time of modulation of BPM and PPM. For example, tracking of synchronism detection waves can be achieved by controlling the timing of template generation such that the Q channel output is kept at zero, since the output amplitude becomes the maximum in the I channel in this condition.

Obviously, it is possible to use the circuits shown in FIG. 1 and FIGS. 11A and 11B as the template pulse generating circuit 1509.

The pulse generating circuit in this embodiment can generate a plurality of pulse signals having predetermined phase difference by using simple circuits. When signal pairs having phase difference of 180 degrees are generated, balanced type pulse signals are obtained. When four signals having phase difference of 90 degrees for each are generated, differential type I and Q signals are obtained. The pulse signals generated by the pulse generating circuit can accurately control phase difference as signals having less variances in amplitude between signals and preferable balance with less distortion. Thus, the pulse generating circuit has all the specifications required for high performance of the UWB transmitting and receiving device such as differential type signal generation, I and Q signal generation, and low distortion. Thus, the UWB transmitting and receiving device can achieve high performance when the pulse generating circuit in this embodiment is included.

Additionally, a CMOS integrated circuit including the pulse generating circuit according to this embodiment consumes power only during transition time in pulse generation, and requires no standby current. A communication device including this pulse generating circuit can operate with the minimum power consumption at all times according to the information volume (bit rate) of transmission.

Particularly, the UWB communication is appropriate for short-distance high-speed communication, and transmission volume of larger than Gbps (gigabit/sec.) which has been impossible in the related-art wireless communication can be expected. This level is not achieved by any types of the related-art wireless communication system, and is difficult in various aspects even in case of wire communication paths. The operation of the circuits employed for UWB communication (IR) using pulses is intermittent, and thus power supply is required for the circuit only while pulses are active. Thus, power consumed by the circuit can be considerably reduced. Since the operation is intermittent, various disturbances given to the operation of the device to which this system is incorporated and disturbances given to the system from the device can be reduced. When the UWB communication including the pulse generating circuit is applied to data transmission, lower power and higher speed communication can be achieved than those of communication provided by connection with the related-art copper wire (wire paths). In this case, disturbance to the outside is reduced, and interference durability is improved. Thus, when the UWB communication device is applied to extremely short distance large volume data. transmission within the same housing, a highly effective system can be provided.

According to the embodiments described herein, the predetermined starting time difference is set at td and td/2. However, the starting time difference may be 2 td/3, for example. In this case, three-phase pulse signal sets having phase difference of 120 degrees can be obtained. Thus, signals having arbitrary phase difference can be produced by controlling the predetermined starting time difference according to the situations.

The technologies according to the embodiments are particularly effective when applied to UWB communication using short pulses.

The entire disclosure of Japanese Patent Application No. 2008-042517, filed Feb. 25, 2008 is expressly incorporated by reference herein.

What is claimed is:

1. A pulse generating circuit, comprising:
 a starting circuit which generates m starting signals at predetermined time intervals based on a generation starting signal, wherein m is an integer greater than or equal to two; and
 m pulse wave generating sub circuits which have the same characteristics and generate pulse waves having pulse width Pw for n cycles based on the respective m starting signals, wherein n is an integer greater than or equal to one,
 wherein the m pulse wave generating sub circuits include a plurality of inverter delay circuits each delay of which is set at the pulse width Pw, and a pulse wave generating logic circuit which generates the pulse waves based on output signals from the plural inverter delay circuits.

2. The pulse generating circuit according to claim 1, wherein:
m is equal to two; and
each of the pulse wave generating sub circuits generates the pulse waves based on the corresponding one of the m starting signals generated from the starting circuit which sets the predetermined time interval at the pulse width Pw.

3. The pulse generating circuit according to claim 2, further comprising a cross-coupled inverter connected between output nodes where the phases of the outputs from the inverter delay circuits contained in the pulse wave generating sub circuits are reversed in a predetermined pair of the m pulse wave generating sub circuits.

4. The pulse generating circuit according to claim 1, wherein:
m is equal to two; and
each of the pulse wave generating sub circuits generates the pulse waves based on the corresponding one of the m starting signals generated from the starting circuit which sets the predetermined time interval at the pulse width Pw/2.

5. The pulse generating circuit according to claim 4, further comprising an adding and subtracting circuit which achieves addition and subtraction of the pulse waves generated from the respective pulse wave generating sub circuits.

6. The pulse generating circuit according to claim 1, wherein:
m is equal to four; and
each of the pulse wave generating sub circuits generates the pulse waves based on the corresponding one of the m starting signals generated from the starting circuit which sets the predetermined time interval at the pulse width Pw/2.

7. The pulse generating circuit according to claim 1, wherein the starting circuit includes a bi-phase signal generating circuit for generating signals of two phases which simultaneously rise and fall based on the generation starting signal, and the inverter delay circuit connected to one of output signals from the bi-phase signal generating circuit.

8. The pulse generating circuit according to claim 1, wherein the starting circuit includes a first delay circuit producing delay set at the pulse width Pw and a second delay circuit producing delay set at a value equivalent to the pulse width Pw×1.5.

9. The pulse generating circuit according to claim 1, further comprising a starting signal selecting circuit which selects one pulse wave generating sub circuit which receives the m starting signals generated from the starting circuit from the m pulse wave generating sub circuits based on transmitted data.

10. The pulse generating circuit according to claim 1, further comprising an output selecting circuit which selects one pulse wave output target which receives the pulse waves generated from the m pulse wave generating sub circuits from pulse wave output targets based on transmitted data.

11. An ultra-wideband (UWB) communication system, comprising the pulse generating circuit according to claim 1.

12. The pulse generating circuit according to claim 1, wherein the pulse width of the generation starting signal inputted to the starting circuit is equal to and larger than the pulse width Pw and smaller than a value equivalent to Pw×4×n.

13. The pulse generating circuit according to claim 1, wherein the cycle of the generation starting signal inputted to the starting circuit is a cycle equivalent to a value an even number times larger than the pulse width Pw.

14. The pulse generating circuit according to claim 1, wherein the inverter delay circuits control delay of the inverter delay circuits based on an outside control signal.

* * * * *